(12) United States Patent
Taniyoshi

(10) Patent No.: US 6,351,756 B1
(45) Date of Patent: Feb. 26, 2002

(54) CLOCK SIGNAL MULTIPLIER CIRCUIT FOR A CLOCK SIGNAL GENERATOR CIRCUIT

(75) Inventor: Itsurou Taniyoshi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/299,905

(22) Filed: Apr. 28, 1999

(30) Foreign Application Priority Data

Apr. 28, 1998 (JP) .......................................... 10-119553

(51) Int. Cl.⁷ .............................................. G06F 7/52
(52) U.S. Cl. ...................................... 708/103; 327/116
(58) Field of Search ........................... 708/103; 327/116

(56) References Cited

U.S. PATENT DOCUMENTS 5,045,715 A * 9/1991 Fitch .......................... 327/116
5,854,755 A * 12/1998 Park et al. .................. 708/103

* cited by examiner

Primary Examiner—Tan V. Mai
(74) Attorney, Agent, or Firm—McGinn & Gibb, PLLC

(57) ABSTRACT

The present invention provides a multiplying circuit comprising: an oscillation control circuit for alternately activating first and second oscillation control signals for every clocks of an input clock signal; a first pulse signal generator circuit connected to the oscillation control circuit for receiving the first oscillation control signal so that the first pulse signal generator circuit generates a first multiplied clock signal having a higher frequency than the input clock signal only when the first oscillation control signal is in an activated state; a second pulse signal generator circuit connected to the oscillation control circuit for receiving the second oscillation control signal so that the second pulse signal generator circuit generates a second multiplied clock signal having a higher frequency than the input clock signal only when the second oscillation control signal is in an activated state; and an output circuit connected to the first and second pulse signal generator circuits for receiving the first and second multiplied clock signals and selectively outputting the first and second multiplied clock signals as an multiplied output clock signal.

19 Claims, 14 Drawing Sheets

US 6,351,756 B1

CLOCK SIGNAL MULTIPLIER CIRCUIT FOR A CLOCK SIGNAL GENERATOR CIRCUIT

BACKGROUND OF THE INVENTION

The present invention relates to a clock signal multiplier circuit for a clock signal generator.

The clock signal multiplier circuit is used for multiplying a clock signal frequency to increase the frequency of the externally inputted clock signal. One of the conventional clock signal multiplier circuit is disclosed in Japanese laid-open patent publication No. 2-177715. FIG. 1 is a circuit diagram illustrative of a first conventional clock signal multiplier circuit. The circuit configuration and operation will be described briefly. A clock signal 101 is inputted into an input terminal of the conventional clock signal multiplier circuit A frequency divider 94 is connected to the input terminal for receiving the input clock signal 101 to generate a frequency increased signal having a higher frequency by two times than the clock signal. A shift resistor circuit 95 is connected to the frequency divider 94 for receiving the frequency increased signal to adjust a duty ratio of the frequency increased signal. The conventional clock signal multiplier circuit generates an output clock signal 118 having a frequency higher by two times than the input clock signal 101, whereby the conventional clock signal multiplier circuit is capable of two times multiplication in frequency of the inputted lock signal. More detail descriptions will be made as follows.

An oscillator 91 is provided for generating a reference clock signal 201 having a frequency higher by m-times than the frequency of the input clock signal 101. A counter circuit 92 is provided which is connected to the oscillator 91 for receiving both the input clock signal 101 and the reference clock signal 201 in order to count clock numbers of the reference clock signal 201 within a high level period corresponding to a half cycle which is defined between a rising edge and a failing edge of the input clock signal 101. The counter circuit 92 counts one clock for the one cycle and generates a counter output signal 202.

A latch circuit 93 is also provided which is connected to be the counter 92 and the oscillator 91 as well as connected to the input terminal 101 for receiving both the counter output signal 202 from the counter circuit 92 and the input clock signal 101 so that the latch circuit 93 latches a value of the counter output signal 202 in response to the fall-edge of the in put clock signal 101, in order to generate a latch output signal 203. The latch circuit 93 continues to latch the value or level of the counter output signal 202 during one cycle of the input clock signal 101.

A frequency divider 94 is provided which is connected to the latch circuit 93 and the oscillator 91 for receiving both the reference clock signal 201 from the oscillator 91 and the latch output signal 203 from the latch circuit 93. The frequency divider 94 accommodates a counter, so that the frequency divider circuit 94 generates a frequency dividing signal 204 with the high level and a width corresponding to one cycle of the reference clock signal 201 every when the number of the inputted reference clock signal 201 becomes the same as the number of the counted value which is indicated by the counter output signal 203. The latch output signal 203 includes an upper significant bat signal 206 and a lower significant bit signal 207. Namely, the high level signal is outputted one time for every one half cycle of the input clock signal 101. This means that the frequency divided signal 204 has a frequency higher by two times than the input clock signal 101.

A shift resistor circuit 95 is also provided which is connected to the frequency divider circuit 94, the lath circuit 93 and the input terminal for receiving the input clock signal 101, the upper but signal 206 of the latch output signal 203 and the frequency divided signal 204, so that every when the shift resistor circuit 95 receives the reference clock signal 201, then the shift resistor circuit 95 extends the high level period of the frequency divided signal 204 by one cycle of the reference clock signal 201, whereby the high level period is extended to two cycles, three cycles, four cycles and five cycles. The upper significant bit signal 206 controls the width of extension of the clock As a result, the shift resistor circuit 95 generates a shift resistor output signal 205 having the same one cycle period as the frequency divided signal 204 but different high level period from the frequency divided signal 204.

If the counted value of the latch circuit 93 is "6", then a duty ratio of the high level period to the low level period of the frequency divided signal 204 is 1:5, whilst the shift resistor output signal 205 has a different duty ratio of 3:3 from the frequency divided signal 204. If the counted value of the latch circuit 93 is "5", then the frequency divided signal 204 has a duty ratio of 1:4, whilst the shift resistor output signal 205 has a different duty ratio of 2:3 from the frequency divided signal 204.

A flip flop circuit 97 is also provided which is connected to the shift resistor circuit 95 and also connected through an invertor 96 to the oscillator 91, so that the flip flop circuit 97 receives the sit resistor output signal 205 from the shift resistor circuit 95 and an inverted reference clock signal 208 from the invertor 96. If the counted value of the latch circuit 93 is odd number, then the flip flop circuit 97 compensates the duty ratio but only of non-50% ratio of the shift resistor output signal 205. The flip flop circuit 97 is operated to latch the shift resistor output signal 205 in response to the rising edge of the inverted reference clock signal 208, so that the flip flop circuit 97 performs a logical sum or "OR-operation" of the latched signal and the shift resistor output signal 205, in order to generate a flip flop output signal 209 which has a high level period extended from the high level period of the shift resistor output signal 205 by one half cycle period of the reference clock signal 201. If the counted value of the latch circuit 93 is odd number, then the shift resistor output signal 205 has a duty ratio of 2.5:2.5.

A selector 98 is also provided which is connected to both the shift resistor circuit 95 and the flip flop circuit 97 for receiving both the shift resistor output signal 205 and the flip flop output signal 209, in order to select any one of the shift resistor output signal 205 and the flip flop output signal 209 and outputs the selected one of the shift resistor output signal 205 and the flip flop output signal 209. The selector 98 is also connected to the latch circuit 93 for receiving the lower significant bit signal 207 of the latch output signal 203, so that if the lower significant bit signal 207 of the latch output signal 203 is "0", then the selector 98 selects the shift resistor output signal 205, whilst if the lower significant bit signal 207 of the latch output signal 203 is "1", then the selector 98 selects the flip flop output signal 209. Namely, if the above counted value of the latch circuit 93 is even number, then the selector 98 selects the shift resistor output signal 205. If the above counted value of the latch circuit 93 is odd number, then the selector 98 selects the flip flop output signal 209.

Consequently, the above conventional clock signal frequency multiplier circuit is capable of generating two-times multiplied clock signals having a 50% duty ratio to the input clock signal and also having a higher frequency by two times than the input or original clock signals.

The above conventional clock signal frequency multiplier circuit is, however, engaged with the following problems.

The first problem is that the conventional clock signal frequency multiplier circuit is capable of generating but only the two-times multiplied clock signal. In order to obtain four-times multiplied clock signal with a 50% duty ratio, it is required that two of the conventional clock signal frequency multiplier circuit are connected in series thereby increasing tho circuit scale. In order to obtain eight-times multiplied clock signal with a 50% duty ratio, it is required that three of the conventional clock signal frequency multiplier circuit are connected in series thereby further increasing the circuit scale.

The second problem is that it is necessary to provide an oscillator which is capable of generating a reference clock signal having a frequency higher by two times than the input clock signal, for which reason if a plural of the above conventional clock signal frequency multiplier circuit are connected in series, then an influence of the frequency characteristics of the oscillator is sufficiently large for making it difficult to realize the clock signal having an accurate frequency.

The third problem is that the lower significant bit signal of the counter in the latch circuit operated by the reference clock signal supplied by the oscillator is used to select the output clock signal, for which reason a jitter characteristic or a fluctuation characteristic depends upon the frequency characteristic of the oscillator. If the frequency of the reference clock signal generated by the oscillator is 400 MHz to set a cyclic period of 25 nanoseconds, then the two times multiplier circuit has a jitter or a fluctuation of 1.25 nanoseconds even the output clock signal may be shifted by one half bit of the reference clock signal.

The fourth problem is that the clock number of the reference clock signal generated by the oscillator is counted during the high level period of the input clock signal in order to generate the two-times multiplied clock signal, for which reason if the duty ratio of the input clock signal varies from the predetermined value, this means that the high level period of the input clock signal varies from the predetermined value, whereby the clock number counted during the high level period of the input clock signal is also changed. As a result, the multiplied clock signal has a different duty ratio of the high level period defined by the varied high level period of the input clock signal to the low level period defined by the varied low level period of the input clock signal.

In the above stances, it had been required to develop a novel clock signal frequency multiplier circuit free from the above problems.

SUMMARY OF THE INVENTION

Accordingly, it is an object of the present invention to provide a novel clock signal frequency multiplier circuit free from the above problems.

The present invention provides a multiplying circuit comprising: an oscillation control circuit for alternately activating first and second oscillation control signals for every clocks of an input clock signal; a first pulse signal generator circuit connected to the oscillation control circuit for receiving the first oscillation control signal so that the first pulse signal generator circuit generates a first multiplied clock signal having a higher frequency than the input clock signal only when the first oscillation control signal is in an activated state; a second pulse signal generator circuit connected to the oscillation control circuit for receiving the second oscillation control signal so that the second pulse signal generator circuit generates a second multiplied clock signal having a higher frequency than the input clock signal only when the second oscillation control signal is in an activated state; and an output circuit connected to the first and second pulse signal generator circuits for receiving the first and second multiplied clock signals and selectively outputting the first and second multiplied clock signals as an multiplied output clock signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
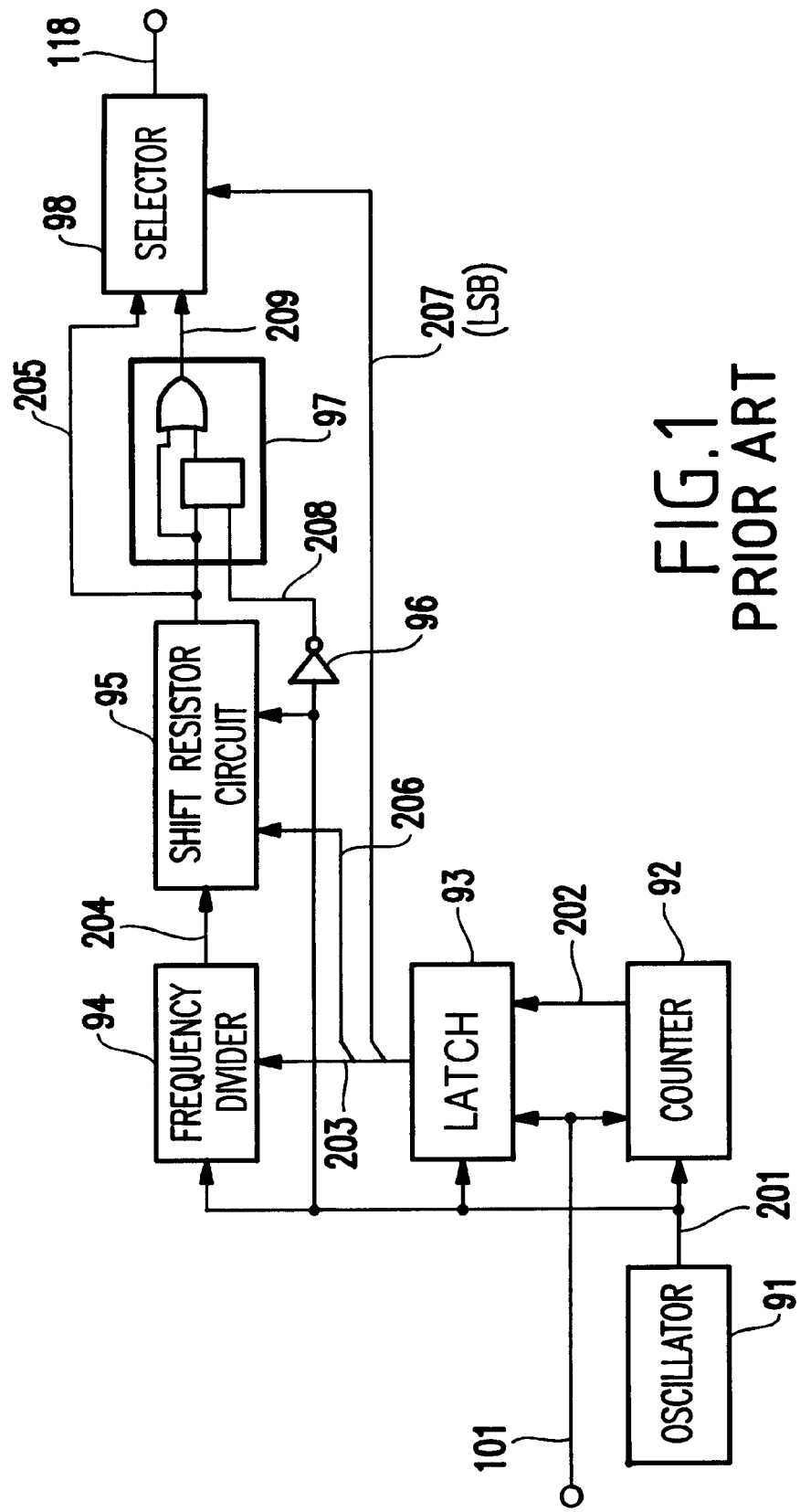
FIG. 1 is a circuit diagram illustrative of a first conventional clock signal multiplier circuit.

The present invention provides a multiply circuit comprising: an oscillation control circuit for alternately activating first and second oscillation control signals for every clocks of an input clock signal; a first pulse signal generator circuit connected to the oscillation control circuit for receiving the first oscillation control signal so that the first pulse signal generator circuit generates a first multiplied clock signal having a higher frequency than the input clock signal only when the first oscillation control signal is in an activated state; a second pulse signal generator circuit connected to the oscillation control circuit for receiving the second oscillation control signal so that the second pulse signal generator circuit generates a second multiplied clock signal having a higher frequency than the input clock signal only when the second oscillation control signal is in an activated state; and an output circuit connected to the first and second pulse signal generator circuits for receiving the first and second multiplied clock signals and selectively outputting the fast and second multiplied clock signals as an multiplied output clock signal.

It is preferable that each of the first and second pulse signal generator circuits bas a multiplication control circuit which receives a multiplication setting signal equally supplied so that the clock signal is multiplied by a multiplication number defined by the, multiplication setting signal thereby outputting the first and second multiplied clock signals from the first and second pulse signal generator circuits respectively.

It is further preferable that the output circuit performs a function of logical OR of the first and second multiplied clock signals to output the multiplied output clock signal.

It is also preferable that the output circuit performs functions of frequency vision and subsequent logical OR of the first and second multiplied clock signals to output the multiplied output clock signal.

It is also preferable that first and second clock numbers of the first and second multiplied clock signals are made correspond to first and second multiplication numbers presented by the multiplication setting signal during one cyclic period of the input clock signal It is further preferable that each of the first and second pulse signal generator circuits comprises: an oscillator connected to the oscillation control circuit for receipt of the first oscillation control signal so that the oscillator generates an oscillation clock signal as a multiplication clock signal under control by the first oscillation control signal; and a multiplication control circuit connected to the oscillation control circuit for receipt of the first oscillation control signal and also connected to the oscillator for receipt of the oscillation clock signal and a multiplication setting signal externally supplied so that when the oscillation clock signal is generated which has a multiplication number presented by the multiplication setting signal, the multiplication control circuit generates an oscillation inhibit signal which is transmitted to the oscillator whereby the oscillator is inhibited to generate the oscillation clock signal.

It is further more preferable that the multiplication control circuit performs comparison in end timing between one cyclic period of the input clock signal and a period of a multiplication oscillation by the oscillation clock signal, so that if the oscillation clock signal is advanced in phase as compared to the input clock signal, then the multiplication control circuit generates a first level phase comparison signal, and if the oscillation clock signal is delayed in phase a compared to the input clock signal, then the multiplication control circuit generates a second level phase comparison signal, and wherein the oscillator falls a frequency of the oscillation clock signal upon receipt of the first level phase comparison signal, whilst the oscillator rises a frequency of the oscillation clock signal upon receipt of the second level phase comparison signal.

It is moreover preferable that the oscillator comprises plural stages of delay circuits connected in series to each other so that the oscillator is increased in a number of the stages upon receipt of the first level phase comparison signal, whilst the oscillator is decreased in a number of the stages upon receipt of the second level phase comparison signal.

It is also preferable that the oscillator has a pulse width adjustment circuit for adjusting clock width of each clock of the oscillation clock signal.

In accordance with the present invention, the pulse generation circuit is capable of setting the optional or selectable number of multiplication for control to the oscillation control signal of the oscillator, so as to change the number of the multiplication for generating the various number-multiplied clock signal without increase in the circuit scale of the circuit.

Further, two pulse signal generator circuits are provided so that those two pulse signal generator circuits alternately generate the two output clock signals for every cycles of the input clock signal, whereby the multiplied output clock signal is free from the duty ratio of the input clock signal.

Furthermore, the above, multiplier circuit comprises only logic gates so that the circuit is capable of generating the multiplied clock signal with a small fluctuation or jitter but free from the influences of the variation of the process conditions and variation in power voltage level.

The other present invention provides a multiplying circuit comprising: at least an oscillation control circuit for alternately activating a plurality of oscillation control signals for every clocks of an input clock signal; a plurality of pulse signal generator circuits individually corresponding to the oscillation control signals connected to the oscillation control circuit for allowing each of the pulse signal generator circuits to receive corresponding one of the oscillation control signals so that each of the pulse signal generator circuit performs to generates an individual multiplied clock signal having higher frequencies than the input clock signal only when the corresponding one of the oscillation control signals is in an activated state; and an output circuit connected to the pulse signal generator circuits for receiving the individual multiplied clock signals from the pulse signal generator circuits and selectively outputting the multiplied clock signals as an multiplied output clock signal.

It is preferable that the plurality of pulse signal generator circuits comprises: a first pulse signal generator circuit connected to the oscillation control circuit for receiving the first oscillation control signal so that the first pulse signal generator circuit generates a first multiplied clock signal having a higher frequency than the input clock signal only when the first oscillation control signal is in an activated state; and a second pulse signal generator circuit connected to the oscillation control circuit for receiving the second oscillation control signal so that the second pulse signal generator circuit generates a second multiplied clock signal having a higher frequency than the input clock signal only when the second oscillation control signal is in an activated state.

It is further preferable that each of the first and second pulse signal generator circuits has a multiplication control circuit which receives a multiplication setting signal externally supplied so that the clock signal is multiplied by a multiplication number defied by the multiplication setting signal thereby outputting the first and second multiplied clock signals from the first and second pulse signal generator circuits respectively.

It is further more preferable that the output circuit performs a function of logical OR of the first and second multiplied clock signals to output the multiplied output clock signal.

It is moreover preferable that the output circuit performs functions of frequency-division and subsequent logical OR of the first and second multiplied clock signals to output the multiplied output clock signal.

It is also preferable that first and second clock numbers of the first and second multiplied clock signals are made correspond to first and second multiplication numbers presented by the multiplication setting signal during one cyclic period of the input clock signal.

It is also preferable that each of the first and second pulse signal generator circuits comprises: an oscillator connected to the oscillation control circuit for receipt of the first oscillation control signal so that the oscillator generates an oscillation clock signal as a multiplication clock signal under control by the first oscillation control signal; and a multiplication control circuit connected to the oscillation control circuit for receipt of the first oscillation control signal and also connected to the oscillator for receipt of the oscillation clock signal and a multiplication setting signal externally supplied so that when the oscillation clock signal is generated which has a multiplication number presented by the multiplication setting signal, the multiplication control circuit generates an oscillation inhibit signal which is transmitted to the oscillator whereby the oscillator is inhibited to generate the oscillation clock signal.

It is further preferable that the multiplication control circuit performs comparison in end timing between one cyclic period of the input clock signal and a period of a multiplication oscillation by the oscillation clock signal, so that if the oscillation clock signal is advanced in phase as compared to the input clock signal then the multiplication control circuit generates a first level phase comparison signal, and if the oscillation clock signal is delayed in phase as compared to the input clock signal, then the multiplication control it generates a second level phase comparison signal, and wherein the oscillator falls a frequency of the oscillation clock signal upon receipt of the first level phase comparison signal whilst the oscillator rises a frequency of the oscillation clock signal upon receipt of the second level phase comparison signal.

It is further more preferable that the oscillator comprises plural stages of delay circuits connected in series to each other so that the oscillator is increased in a number of the stages upon receipt of the first level phase comparison signal, whilst the oscillator is decreased in a number of the stages upon receipt of the second level phase comparison It is moreover preferable that the oscillator has a pulse width adjustment circuit for adjusting clock width of each clock of the oscillation clock signal.

In accordance with the other present invention, the pulse generation circuit is capable of setting the optional or selectable number of multiplication for control to the oscillation control signal of the oscillator, so as to change the number of the multiplication for generating the various number-multiplied clock signal without increase in the circuit scale of the circuit Further, two pulse signal generator circuits are provided so that those two pulse signal generator circuits alternately generate the two output clock signals for every cycles of the input clock signal, whereby the multiplied output clock signal is free from the duty ratio of the input clock signal.

Furthermore, the above multiplier circuit comprises only logic gates so that the circuit is capable of generating the multiplied clock signal with a small fluctuation or jitter but free from the influences of the variation of the process conditions and variation in power voltage level.

A first embodiment according to the present invention will be described in detail with reference to FIG. 2 which is a circuit diagram illustrative of a first novel clock signal frequency multiplier circuit. The first novel clock signal frequency multiplier circuit has first and second pulse signal generator circuits which generate alternately first and second multiplied clock signal for every cycles of an input clock signal.

First and second pulse signal generator circuits 1 and 2 are provided for generating alternately first and second multiplied clock signals for every cycles of an input clock signal, wherein the first multiplied clock signal is generated by the first pulse signal generator circuit 1 for every other cycles of the input clock signals, whilst the second multiplied clock signal is generated by the second pulse signal generator circuit 2 for every other cycles of the input clock signals, so that the first and second multiplied clock signals are generated alternately for every cycles of the input clock signals.

An oscillator control circuit 3 is provided which is connected to an input terminal for receiving an input clock signal 101 and generates first and second oscillation control signals 103 and 104 as divided signals. The oscillator control circuit 3 is also connected to the first and second pulse signal generator circuits 1 and 2 for allowing the first and second oscillation control signals 103 and 104 to be transmitted into the first and second pulse signal generator circuits 1 and 2 respectively, whereby the first and second pulse signal generator circuits 1 and 2 are controlled by the first and second oscillation control signals 103 and 104 respectively. The second oscillation control signal 104 is an inversion signal to the first oscillation control signal 103. The first oscillation control signal 103 becomes high level for every other cycles of the input clock signals 101 whist the second oscillation control signal 104 becomes high level for every other cycles of the input clock signals 101, so that the first and second oscillation control signals 103 and 104 alternately become high levels for every cycles of the input clock signals 101. During when the first oscillation control signal 103 is in the high level, the first pulse signal generator circuit 1 generates the first multiplied clock signal 117. During when the second oscillation control signal 104 is in the high level the second pulse signal generator circuit 2 generates the second multiplied clock signal 118. Since the first and second oscillation control signals 103 and 104 alternately become high levels for every cycles of the input clock signals 101, the first and second pulse signal generator circuits 1 and 2 generate the first and second multiplied clock signals 117 and 118 alternately for every cycles of the input clock signal 101.

An OR-circuit 7 is also provided which is connected to both the first and second pulse signal generator circuits 1 and 2 for receiving the first and second multiplied clock signals 117 and 118 to perform the function of the logical OR of the first and second multiplied clock signals 117 and 118 and then generate an output clock signal 119 on an output terminal of the first novel clock signal frequency multiplier circuit.

The first and second pulse signal generator circuits 1 and 2 having the same circuit configuration as each other, wherein each of the first and second pulse signal generator circuits 1 and 2 accommodates an n-multiplication control circuit 9 and an oscillator 8. Operational timing of the oscillator 8 in the first pulse signal generator circuit 1 is controlled by the first oscillation control signal 103, the timing of the other oscillator 8 in the second pulse signal generator circuit 2 is controlled by the second oscillation control signal 104. The n-multiplication control circuit 9 in each of the first and second pulse signal generator circuits 1 and 2 receives a multiplication setting signal 102 so that the n-multiplication control circuit 9 is operated to set information about the desired multiplication number. The n-multiplication control circuit 9 in the first pulse signal generator circuit 1 generates a first phase comparison signal 112 whilst the n-multiplication control circuit 9 in the second pulse signal generator circuit 2 generates a second phase comparison signal 113.

A timing control circuit 4 is also provided which is connected to the input terminal for receiving the input clock signal 101 and generates an up-down control signal 105, a counter clock signal 106, and first and second latch clock signals 107 and 108.

A counter circuit 5 is also provided which is connected to the timing control circuit 4 for receiving the up-down control signal 105 and the counter clock signal 106. The counter circuit 5 is also connected to the n-multiplication control circuits 9 in the first and second pulse signal generator circuits 1 and 2 for receiving the first and second phase comparison signals 112 and 113 from the n-multiplication control circuits 9 in the first and second pulse signal generator its 1 and 2 respectively. The counter circuit 5 generates a counter output signal 109.

A latch circuit 6 is also provided which is connected to the counter circuit S for receiving the counter output signal 109. The latch circuit 6 is also connected to the timing control circuit 4 for receiving the first and second latch clock signals 107 and 108, so that operation timing of the latch circuit 6 is controlled by the first and second latch clock signals 107 and 108. The latch circuit 6 generates first and second delay control signals 110 and 111. The latch circuit 6 is also connected to the oscillators 8 in the first and second pulse signal generator circuits 1 and 2 for transmitting the first and second delay control signals 110 and 111 to the oscillators 8 in the first and second pulse signal generator circuits 1 and 2 respectively, so that frequencies of the oscillators 8 in the first and second pulse signal generator circuits 1 and 2 are controlled by the first and second pulse signal generator circuits 1 and 2 respectively.

Figure 2:
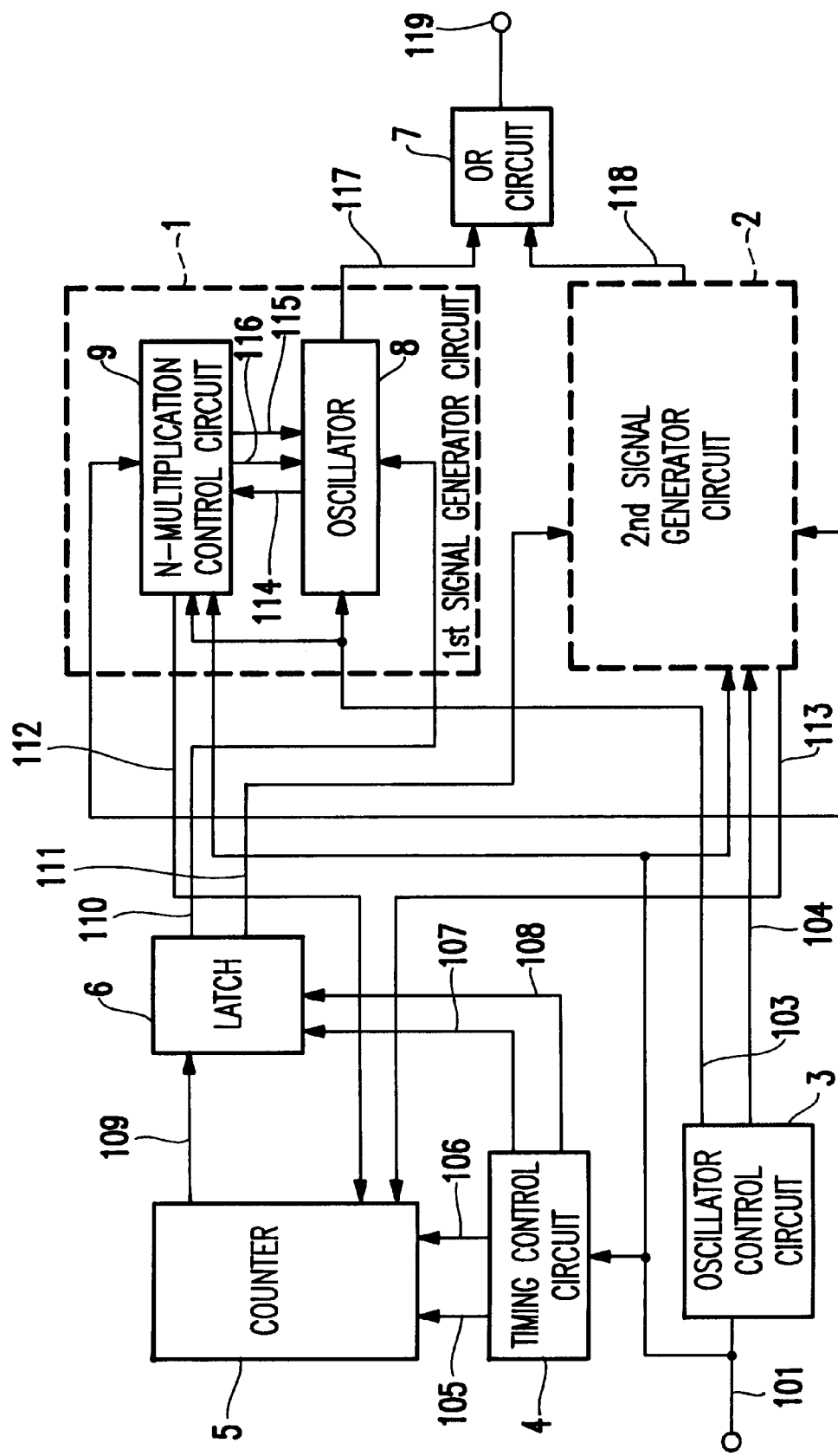
FIG. 2 is a circuit diagram illustrative of a first novel clock signal frequency multiplier circuit in a first embodiment according to the present invention.
Figure 3:
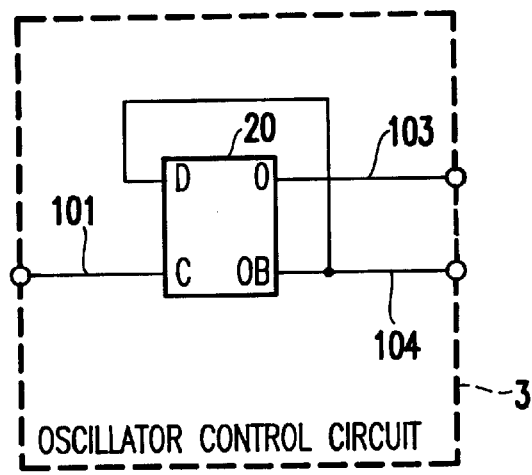
FIG. 3 is a circuit diagram illustrative of an oscillation control circuit in a first novel clock signal frequency multiplier circuit shown in FIG. 2 in the first embodiment in accordance with the present invention.

FIG. 3 is a circuit diagram illustrative of an oscillation control circuit in a first novel clock signal frequency multiplier circuit shown in FIG. 2 in the first embodiment in accordance with the present invention. The oscillation control circuit 2 comprises a flip-flop circuit 20. The flip-flop circuit 20 has a clock input terminal "C" connected to the input terminal for receiving the input clock signal 101, a non-inverted output terminal "O" for outputting the first oscillation control signal 103, an inverted output terminal "OB" for outputting the second oscillation control signal 104 as an inversion in to the fit oscillation control signal 103, and a data input terminal "D" connected to the inverted output terminal "OB" for feeding-back tho second oscillation control signal 104 to the data input terminal "D". The flip-flop circuit 20 generates the first and second oscillation control signs 103 and 104 as divided signals in response to the rising edge of the input clock signal 101. The non-inverted output terminal "O" of this flip-flop circuit 20 is connected to the oscillator 8 and the n-multiplication control circuit 9 in the first pulse signal generator circuit 1 for transmitting the first oscillation control signal 103 to both the oscillator 8 and the n-multiplication control circuit 9 in the first pulse signal generator circuit 1. The inverted output terminal "OB" of this flip-flop circuit 20 is connected to the oscillator 8 and the n-multiplication control circuit 9 in the second pulse signal generator circuit 2 for transmitting the second oscillation control signal 104 to both the oscillator 8 and the n-multiplication control circuit 9 in the second pulse signal generator circuit 2.

Figure 4:
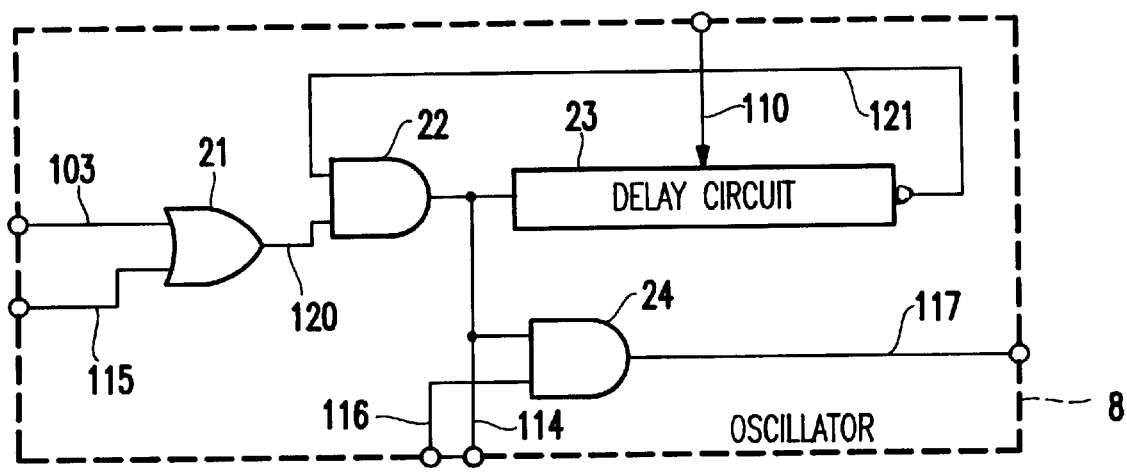
FIG. 4 is a circuit diagram illustrative of an oscillator in each of first and second pulse signal generator circuits in a first novel clock signal frequency multiplier circuit shown in FIG. 2 in the first embodiment in accordance with the present invention.

FIG. 4 is a circuit diagram illustrative of an oscillator in each of first and second pulse signal generator circuits in a first novel clock signal frequency multiplier circuit shown in FIG. 2 in the first embodiment in accordance with the present invention. The oscillator 8 in the first pulse signal generator circuit 1 is operated to generate a first oscillation clock signal 114 upon input of the first oscillation control signal 103 into the oscillator 8 in the first pulse signal generator at 1. The oscillator 8 in the second pulse signal generator circuit 2 is operated to generate a second oscillation clock signal upon input of the second oscillation control signal 104 into the oscillator 8 in the second pulse signal generator circuit 2. Since the oscillator 8 in the first pulse signal generator circuit 1 has the same circuit configuration as the oscillator 8 in the second pulse signal generator circuit 2, then the following description will focus on the oscillator 8 in the first pulse signal generator circuit 1. The oscillator 8 comprises an OR-circuit 21, first and second AND-circuits 22 and 24 and a delay circuit 23. The OR-circuit 21 has two input terminals for receiving the first oscillation control signal 103 and an oscillation inhibit signal 115. The OR-circuit 21 performs the function of logical sum or "OR-operation" of the first oscillation control signal 103 and the oscillation inhibit signal 115, so that if the first oscillation control signal 103 is in the high level, then the OR-circuit 21 performs output of an oscillation enable signal 120 in high level. The first AND circuit 22 has two inputs connected to both the output of the OR-circuit 21 and an output of the delay circuit 23 for receiving the oscillation enable signal 120 from the OR-circuit 21 and an inverted delay signal from the delay circuit 23. The first AND circuit 22 outputs an oscillation clock signal 114 which repeats high and low levels during when the oscillation enable signal 120 is in the high level. The output side of the first AND circuit 22 is further connected to the n-multiplication control circuit 9 for transmitting the oscillation clock signal 114 to the n-multiplication control circuit 9. The delay circuit 23 is also connected to the output side of the first AND circuit 22 for receiving the oscillation clock signal 114. The delay circuit 23 is also connected to the latch circuit 6 for receiving the first delay control signal 110 to change the number of the stage of the delay circuit 23. The delay circuit 23 generates an inverted delay signal 121 which corresponds to inverted levels to the oscillation clock signal 114. This inverted delay signal 121 is fed back to the first AND circuit 22 to form a ring-oscillator circuit. The second AND circuit 24 has two inputs which are connected to the output of the first AND circuit 22 and the n-multiplication control circuit 9 for receiving the oscillation clock signal 114 from the first AND circuit 22 and a mask signal 116 from the n-multiplication control circuit 9. The second AND circuit 24 outputs the first multiplication clock signal 117 as an output signal from the first pulse signal generator 1 so that the first multiplication clock signal 117 is transmitted to the OR-circuit 7. During when the first oscillation control signal 103 is in the high level, the first pulse signal generator circuit 1 generates the first multiplied clock signal 117. During when the second oscillation control signal 104 is in the high level, the second pulse signal generator circuit 2 generates the second multiplied clock signal 118. Since the first and second oscillation control signals 103 and 104 alternately become high levels for every cycles of the input clock signals 101, the first and second pulse signal generator circuits 1 and 2 generate the first and second multiplied clock signals 117 and 118 alternately for every cycles of the input clock signal 101.

Figure 5:
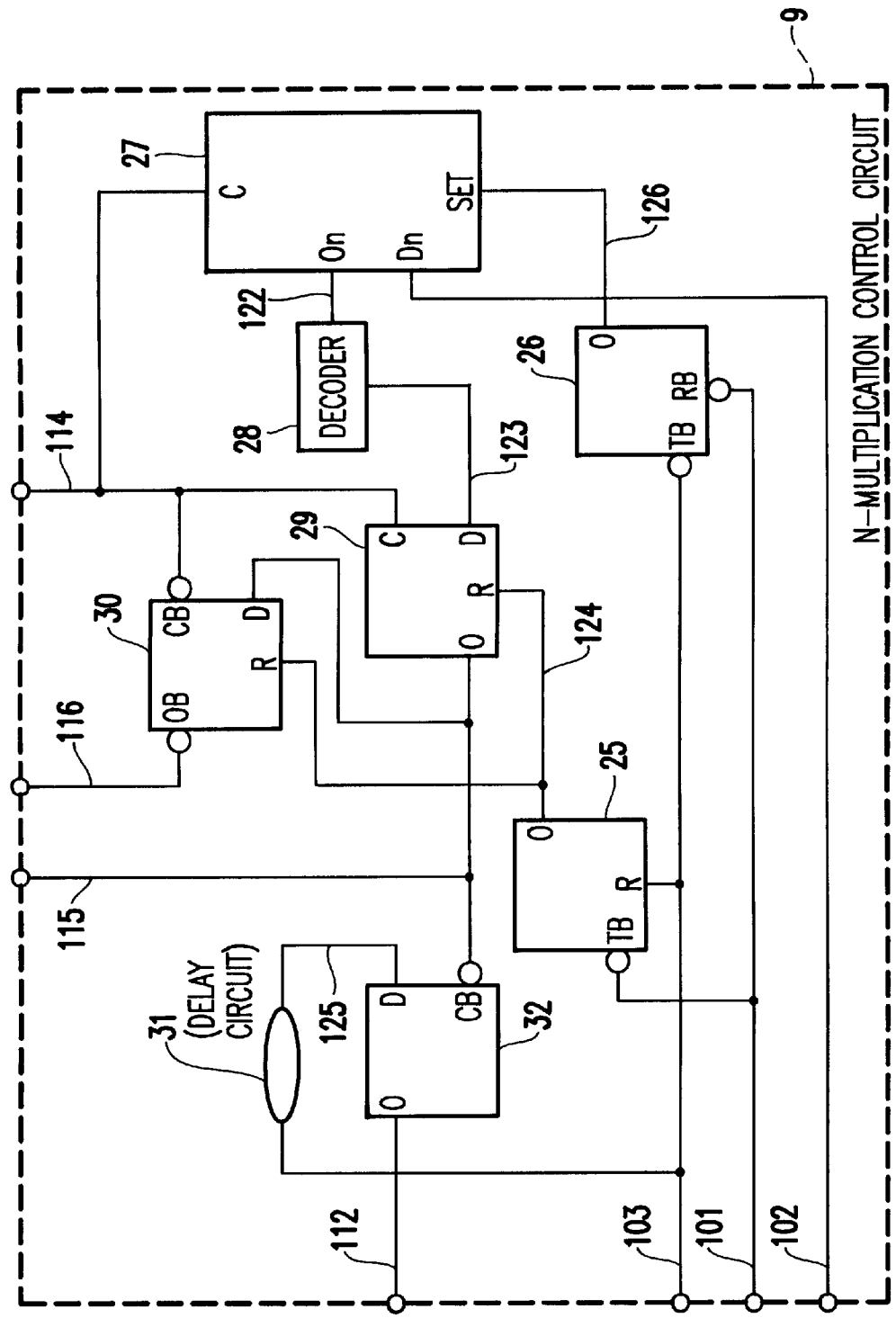
FIG. 5 is a circuit diagram illustrative of an n-multiplication control circuit in each of first and second pulse signal generator circuits in a first novel clock signal frequency multiplier circuit shown in FIG. 2 in the first embodiment in accordance with the present invention.

FIG. 5 is a circuit diagram illustrative of an n-multiplication control circuit in each of first and second pulse signal generator circuits in a first novel clock signal frequency multiplier circuit shown in FIG. 2 in the first embodiment in accordance with the present invention. The n-multiplication control circuit 9 in the first pulse signal generator circuit 1 has the same circuit configuration as the n-multiplication control circuit 9 in the second pulse signal generator circuit 1, for which reason the following descriptions will focus on the circuit configuration and operation of the n-multiplication control circuit 9 in the second pulse signal generator circuit 1. The n-multiplication control circuit 9 comprises an n-digit counter 27, for example, an octenary digit counter performing counting up operations from 0 to 7, a decoder 28, a delay circuit 31, a first flip-flop circuit 25, a second flip-flop circuit 26, a third flip-flop circuit 29, a fourth flip-flop circuit 30, and a fifth flip-flop circuit 32. The n-digit counter 27 is operated to count the clock number of the oscillation clock signal 114 from the oscillator 8 so that when the counted value reaches a predetermined value, then the n-multiplication control circuit 9 generates the oscillation inhibit signal 115 and the mask signal 116, both of which are transmitted to the oscillator 8.

The n-digit counter 27 comprises an octenary digit counter performing counting up operations from 0 to 7 in response to a rising edge of the oscillation clock signal 114 from the oscillator 8 for outputting an counted value as a counter output signal 122 Prior to starting the counting up operations, the n-digit counter 27 receives the multiplication setting signal 102 for setting a multiplication-corresponding value as an initial value. For example, if the two-times multiplied clock signal is required, "5" is set on the n-digit counter 27 as an initial value. If the three-times multiplied clock signal is required, "5" is set on the n-digit counter 27 as an initial value.

The decoder 28 is connected to the n-digit counter 27 so that the counter output signal 122 from the n-digit counter 27 is transmitted to the decoder 28. The decoder 28 generates a decoder output signal 123 in high level when the counted value of the counter 27 reaches the maximum value, for example, "7". The timing of switching from the low level to the high level of the decoder output signal is slightly delayed from the rising edge of the oscillation clock signal 114 due to operating times of the n-digit counter 27 and the decoder 28.

The third flip-flop circuit 29 is provided to latch the level of the decoder output signal 123 from the decoder 28 in response to the rising edge of the oscillation clock signal 114 in order to output the oscillation inhibit signal 115. The oscillation inhibit signal 115 is thus outputted from the n-multiplication control circuit 9 and then transmitted to the OR-circuit 21 in the oscillator 8. The OR-circuit 21 outputs the oscillation enable signal 120 but also during when the oscillation inhibit signal 115 is in the high level.

The fourth flip-flop circuit 30 is provided to latch the level of the oscillation inhibit signal 115 from the third flip-flop circuit 29 in response to the filing edge of the oscillation clock signal 114 in order to invert the latched level to output the mask signal 116. The mask signal 116 is thus outputted from the n-multiplication control circuit 9 and then transmitted to the second AND-circuit 24 in the oscillator 8. The second AND-circuit 24 generates the oscillation clock signal 114 as the multiplication clock signal 117 during when the mask signal 116 is in the high level. The second AND-circuit 24 inhibits the multiplication clock signal 117 during when the mask signal 116 is in the low level.

The second flip-flop circuit 26 is provided to give a timing of setting an initial value to the n-digit counter 27. The second flip-flop circuit 26 is operated to active the counter set signal 126 in response to the falling edge of the oscillation control signal 103. The second flip-flop circuit 26 is also operated to inactive the counter set signal 126 in response to the falling edge of the input clock signal 101. An initial value indicated by the multiplication setting signal 102 is set on the n-digit counter 27 during when the counter set signal 126 is in the high level.

The first flip-flop circuit 25 is provided to output reset signals to the third and fourth flip-flop circuits 29 and 30. The first flip-flop circuit 25 is operated to activate the reset signal 124 into high level in response to the falling edge of the input clock signal 101. The first flip-flop circuit 25 is also operated to inactivate the reset signal 124 into low level in response to the rising edge of the oscillation control signal 103.

The fifth flip-flop circuit 32 is provided to serve as a comparator which compares in phase between the oscillation control signal 103 and the oscillation inhibit signal 115. The oscillation control signal 103 has been delayed by the delay circuit 31 before the delayed oscillation control signal 103 is then inputted into the fifth flip-flop circuit 32. The delay by the delay circuit 31 is set to correspond to gate delays of the OR-circuit 21 and the first AND-circuit 22 in the oscillator 8 as well as the gate delay of the third flip-flop circuit 29. The fifth flip-flop circuit 32 is operated to latch the level of the delayed oscillation control signal 125 in response to the falling edge of the oscillation strop signal 115, thereby to output the first phase comparison signal 112. A difference in timing between the falling edge of the oscillation strop signal 115 and the rising edge of the delayed oscillation control signal 125 is outputted as the first phase comparison signal 112. The first phase comparison signal 112 is outputted from the first pulse signal generator circuit 1 and transmitted to the counter circuit 5. The second phase comparison signal 113 is also outputted from the second pulse signal generator circuit 1 and transmitted to the counter circuit 5.

Figure 6:
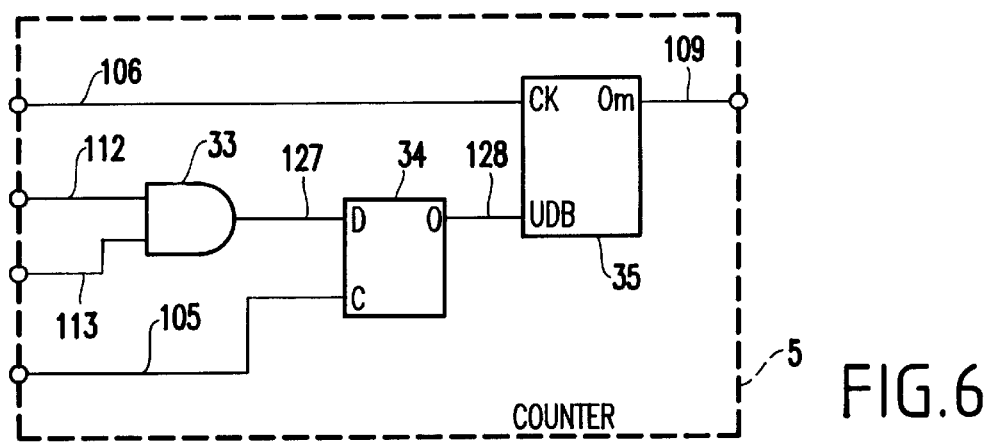
FIG. 6 is a circuit diagram illustrative of a counter circuit in a C first novel clock signal frequency multiplier circuit shown in FIG. 2 in the first embodiment in accordance with the present invention.

FIG. 6 is a circuit diagram illustrative of a counter circuit in a first novel clock signal frequency multiplier circuit shown in FIG. 2 in the first embodiment in accordance with the present invention. The counter circuit 5 comprises an AND-circuit 33, a flip-flop circuit 34 and an up-down counter 35. The first and second phase comparison signals 112 and 113 outputted from the first and second pulse signal generator circuits 1 and 2 are inputted into the AND-circuit 33 and the AND-circuit 33 outputs the phase comparison signal 127. The flip-flop circuit 34 receives the phase comparison signal 127 and latch the level of the phase comparison signal 127, in order to output an up-down signal 128. The up-down counter 35 receives the up-down signal 128 so that the up-down counter 35 shows the count up operation but only when the up-down signal 128 is in the high level, whilst the up-down counter 35 shows the count down operation but only when the up-down signal 128 is in the low level. The up-down counter 35 outputs the counted value as the counter output signal 109. The counted output signal 109 is then inputted into the latch circuit 6.

Figure 7:
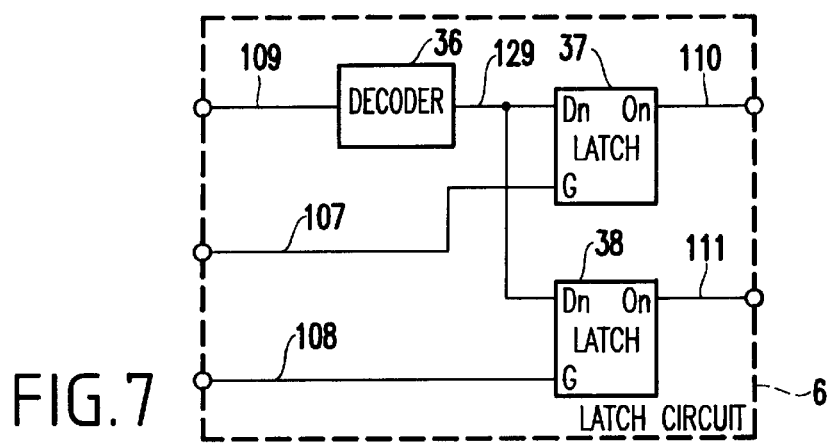
FIG. 7 is a circuit diagram illustrative of a latch circuit in a first novel clock signal frequency multiplier circuit shown in FIG. 2 in the first embodiment in accordance with the present invention.

FIG. 7 is a circuit diagram illustrative of a latch circuit in a first novel clock signal frequency multiplier circuit shown in FIG. 2 in the first embodiment in accordance with the present invention. The latch circuit 6 comprises a decoder circuit 36 and first and second latch circuits 37 and 38. The decoder circuit 36 receives the counted output signal 109 for decoding the same to output a decoder output signal 129. The decoder output signal 129 comprises alignment of "1" on the lower significant bits and alignment of "0" on the higher significant bits. For example, if the counted value is "3", then the decoder output signal 129 comprises alignments of "00000–00111". In this embodiment, the countable range of the up-down counter 35 is 1–36, for which reason the decoder output signal 129 comprises 36 bits data. The first and second latch circuits 37 and 38 receive the decoder output signal 129 for latch the same to output first and second delay control signals 110 and 111 respectively.

Operational timing of the flip-flop circuit 34 of the counter circuit 5 is controlled by the up-down control clock signal 105 generated by the timing control circuit 4. Operational timing of the up-down counter 35 is controlled by the counter clock signal 36. Operational timing of the first and second latch circuits 37 and 38 of the latch circuit 6 are controlled by first and second latch clock signals 107 and 108 generated by the tiring control circuit 4.

Figure 8:
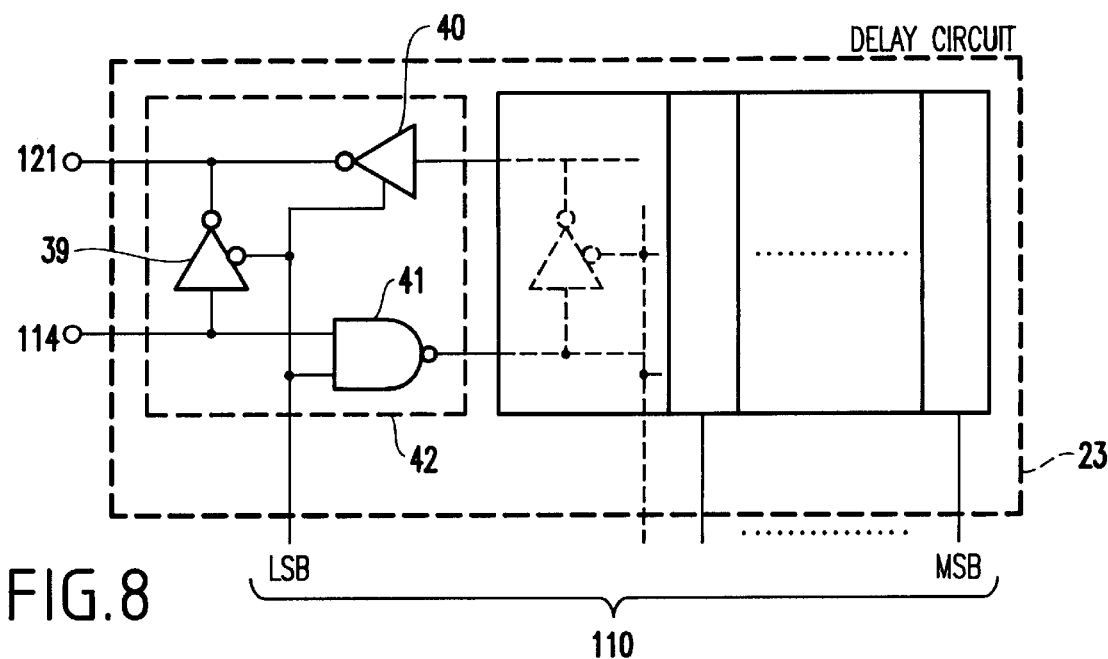
FIG. 8 is a circuit diagram illustrative of a delay circuit in an oscillator shown in FIG. 4 in each of first and second pulse signal generators in a first novel clock signal frequency multiplier circuit shown in FIG. 2 in the first embodiment in accordance with the present invention.

FIG. 8 is a circuit diagram illustrative of a delay circuit in an oscillator shown in FIG. 4 in each of first and second pulse signal generators in a first novel clock signal frequency multiplier circuit shown in FIG. 2 in the first embodiment in accordance with the present invention. The delay circuit 23 in FIG. 4 comprises a series connection of delay blocks which number of the same as the bit number of the delay control signal 110, so that each of the delay blocks 42 receives corresponding one bit of the delay control signal 110. For example, the most left side one of the delay blocks 42 receives the lowest significant bit signal of the delay control signal 110, whilst the most right side one of the delay blocks 42 receives the most significant bit signal of the delay control signal 110. Each of the delay blocks 42 comprises first and send clocked investors 39 and 40 and a single NAND-circuit 41. The first and second clocked investors 39 and 40 are complementary operated to each other. For example, if the high level "1" of the delay control signal 110 is inputted, then the first clocked invertor 39 is not operated whilst the second clocked invertor 40 is operated to transmit the signal from the previous stage to the next stage, if the high level "0" of the delay control signal 110 is inputted, then the second clocked invertor 40 is not operated whilst the first locked invertor 39 is operated to form a path between a line of the oscillation clock signal 114 and a line of the delay inverted signal 121, whereby the signal from the previous stage is inhibited by the second clocked invertor 40. As the counted value of the up-down counter 35 is large or the number of "1" on the lower significant bits is large, then the delay time is also large.

Figure 9:
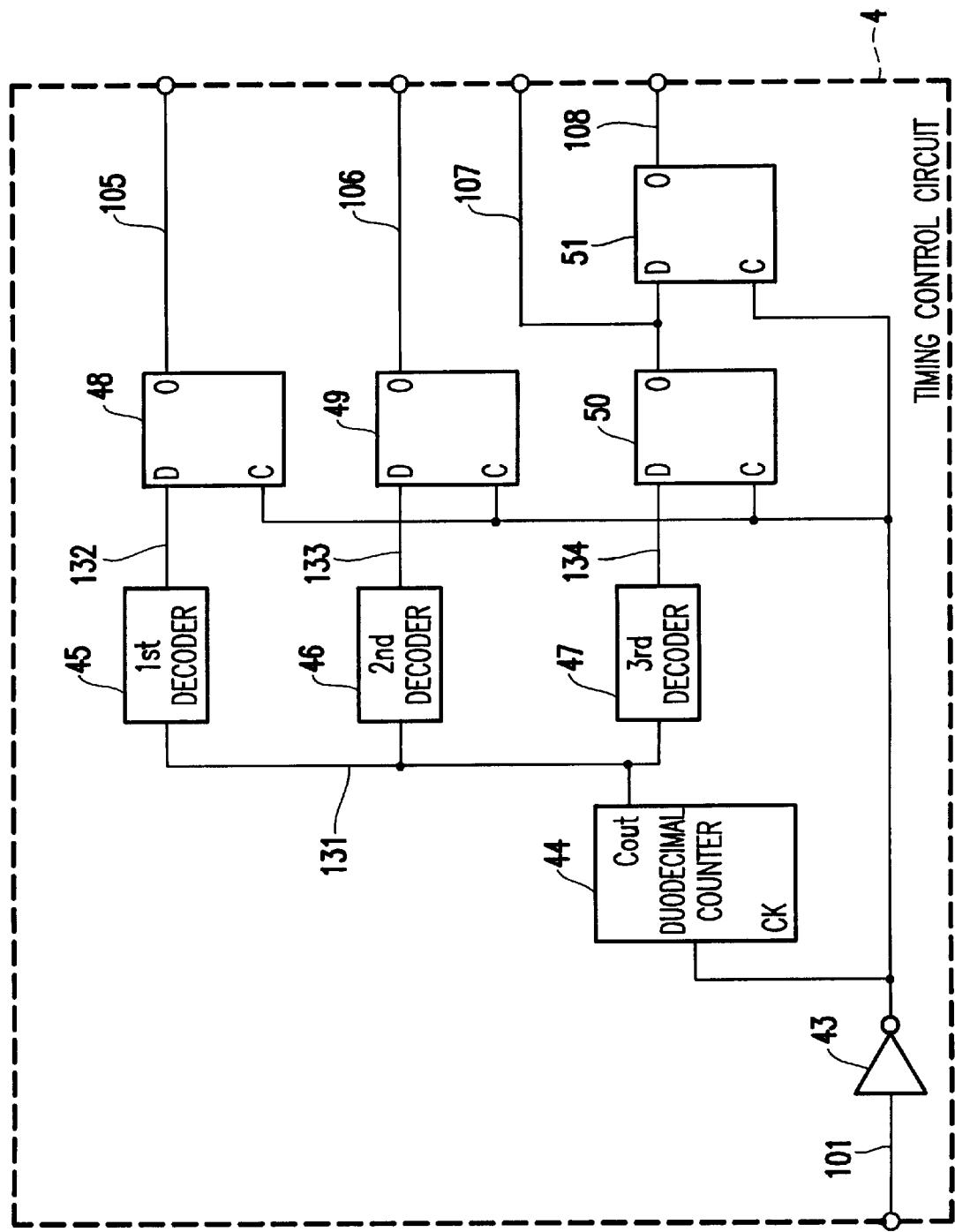
FIG. 9 is a circuit diagram illustrative of a timing control it in a first novel clock signal frequency multiplier circuit shown in FIG. 2 in the first embodiment in accordance with the present invention.

FIG. 9 is a circuit diagram illustrative of a timing control circuit in a first novel clock signal frequency multiplier circuit shown in FIG. 2 in the first embodiment in accordance with the present invention. The timing control circuit 4 is capable of generating various clock signals from the single input clock signal 101. The generated clock signals have one cycle which corresponds to twelve cycles of the input clock signal 101. The timing control circuit comprises a duodenal counter 44, first, second and third decoders 45, 46 and 47 connected to the duodecimal counter 44 in parallel to each other and first, second, third and fourth flip-flop circuits 48, 49, 50 and 51 as well as an invertor 43. The input clock signal 101 is inputted into the timing control circuit 4 and then inverted by the invertor 43 to generate an inverted clock signal 130. Tis timing control circuit 4 is controlled by the rising edge of the inverted clock signal 130, so that the generations of the various clock signals are concurrent to the rising timing of the first and second oscillation control signals 103 and 104. The up-down counter 44 in FIG. 6 and the first and second latch 37 and 38 are provided to control the delay circuit 23, for which reason the change is made during when the oscillator 8 is in the oscillation inhibited period, The duodecimal counter 44 receives the inverted clock signal 130 to generate the counted value in the range of "0" to "11" as a duodecimal counter output signal 131 in response to the rising edge of the inverted clock signal 130. The first, second and third decoders 45, 46 and 47 receive the duodecimal counter output signal 131. The first decoder 45 is operated to output a first decoder output signal 132 in high level when the counted value as the duodecimal counter output signal 131 is "1". The first decoder output signal 132 becomes high level only in the one cycle of the twelve cycles of the inverted clock signal 130. The second decoder 46 is operated to output a second decoder output signal 133 in high level when the counted value as the duodecimal counter output signal 131 is "5". The second decoder output signal 133 becomes high level only in the one cycle of the twelve cycles of the inverted clock signal 130. The third decoder 47 is operated to output a third decoder output signal 134 in high level when the counted value as the duodecimal counter output signal 131 is "7". The third decoder output signal 134 becomes high level only in the one cycle of the twelve cycles of the inverted clock signal 130.

The first flip-flop it 48 receives the first decoder output signal 132 to latch the level of the first decoder output signal 132 in response to the rising edge of the inverted clock signal 130. The first flip-flop circuit 48 outputs at first up-down control clock signal 105 in high level only when the counted value of the duodecimal counter 44 is "2". The second flip-flop circuit 49 receives the second decoder output signal 133 to latch the level of the second decoder output signal 133 in response to the rising edge of the inverted clock signal 130. The second flip-flop circuit 49 outputs a second up-down control clock signal 106 in high level only when the counted value of the duodecimal counter 44 is "6". The third flip-flop circuit 50 receives The third decoder output signal 134 to latch the level of the third decoder output signal 134 in response to the rising edge of the inverted clock signal 130. The third flip-flop circuit 50 outputs a third up-down control clock signal 107 in high level only when the counted value of the duodecimal counter 44 is "8". The fourth flip-flop circuit 51 receives the third up-down control clock signal 107 to latch the level of the third up down control clock signal 107 in response to the rising edge of the inverted clock signal 130. The fourth flip-flop circuit 51 outputs a fourth up-down control clock signal 108 in high level only when the counted value of the duodecimal counter 44 is "9".

The above duodecimal counter 44 may be replaced by other digit counters, for example, an octenary digit counter and a hexadecimal counter provided that the digit number is even.

Subsequently, operations of the above described circuit will be described as follows.

Figure 10:
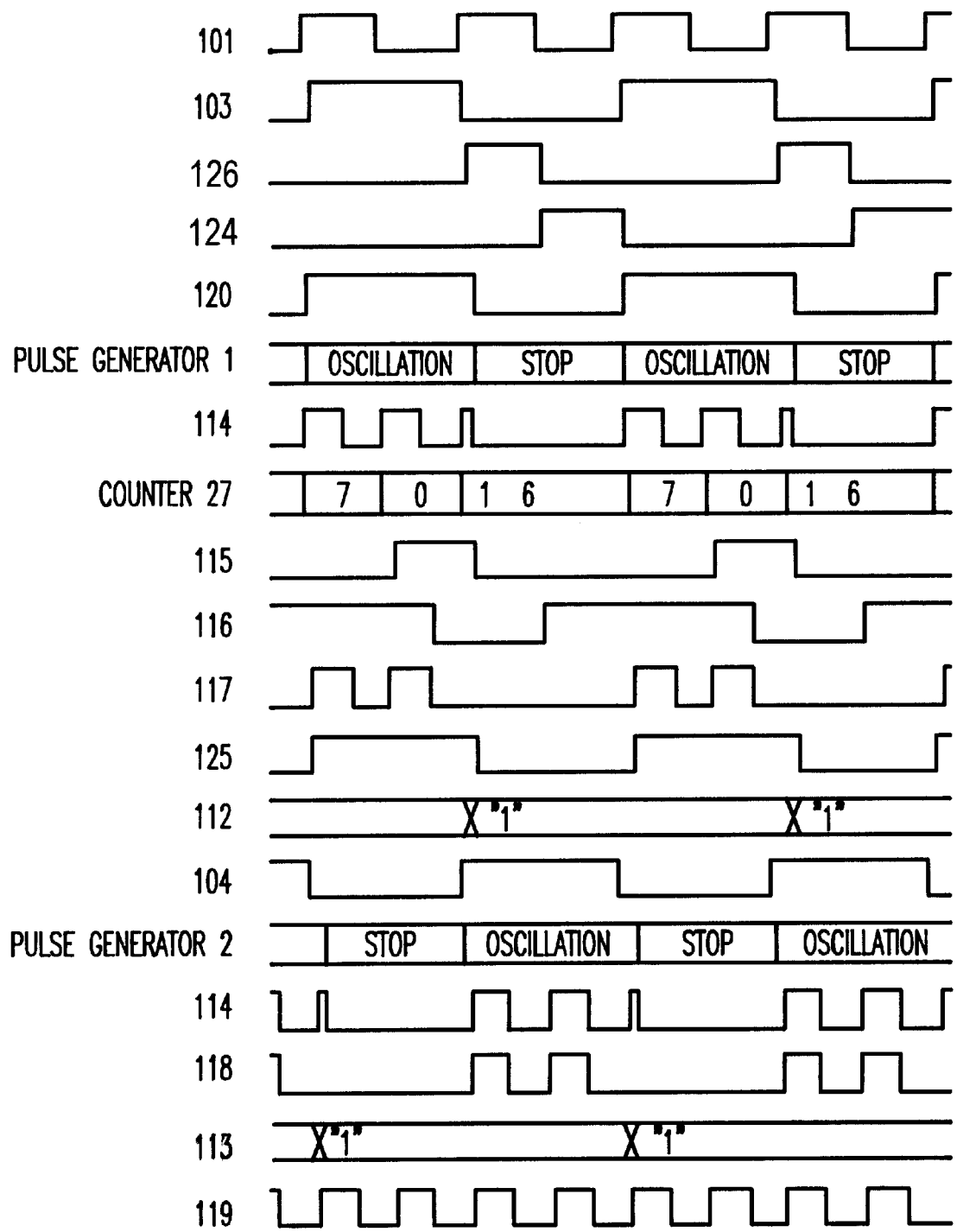
FIG. 10 is a timing chart of the pulse signal generator circuit in a first novel clock signal frequency multiplier circuit shown in FIG. 2 in the first embodiment in accordance with the present invention.

FIG. 10 is a timing chart of the pulse signal generator circuit in a first novel clock signal frequency multiplier circuit shown in FIG. 2 in the first embodiment in accordance with the present invention. The pulse signal generator circuit enters into the oscillation enable state when the oscillation enable signal 120 is in the high level. The pulse signal generator circuit enters into the oscillation inhibited state when the oscillation enable sign 120 is in the low level. The rising edge of the oscillation enable signal 120 is defined by the oscillation control signal 130. The falling edge of tie oscillation enable signal 120 is defined by the oscillation inhibit signal 115.

First, descriptions to the operations of the circuit will start when the pulse signal generator circuit 1 is in the oscillation inhibited state. When the pulse signal generator circuit 1 is in the oscillation inhibited state the n-digit counter 27 is initialized by setting the predetermined multiplication number. The following descriptions will be made assuming that the predetermined multiplication number is 2.

The flip-flop circuit 26 activates the counter set signal 126 in response to the falling edge of the oscillation control signal 103, whereby the n-digit counter 27 is set "6". The counter set signal 126 is reset in response to the failing edge of the input clock signal 101. Concurrently, the flip-flop circuit 25 activates the reset signal 124 and also the flip-flop circuit 30 re-set the mask signal 116 into the high level, whereby the multiplication clock signal 117 is allowed to be outputted. At this time, the flip-flop circuit 29 initializes the oscillation inhibit signal 115 upon the reset signal 124. The oscillation inhibit signal 115 has normally been in the low level before the reset signal 124 is generated. Even if the oscillation inhibit signal 115 has abnormally been in the high level before the reset signal 124 is generated, then the oscillation inhibit signal 115 win be initialized into the low level by the reset signal 124.

Subsequent descriptions will focus on operations when the pulse signal generator circuit 1 is in the oscillation state. The OR-circuit 21 activates the oscillation enable signal 120 to the high level in response to the rising edge of the oscillation control signal 103, whilst the flip-flop circuit 25 inactivates the reset signal 124 into the low level, whereby the pulse signal generator at is placed in the oscillation state.

The AND circuit 22 activates first one of the oscillation clock signals 114 into the high level in response to the rising edge of the oscillation enable signal 120, whereby the output from the n-digit counter 27 is changed from "6" into "7". The decoder 28 outputs the high level signal. The flip-flop circuit 29 activates the oscillation inhibit signal into the high level in response to the rising edge of the oscillation clock signal 114, whereby the output from the n-digit counter 27 is changed from "7" into "0". The decoder 28 outputs the low level signal. Thereafter, the third one of the oscillation clock signals 114 is risen, whilst the oscillation inhabit signal 115 is fallen.

The flip-flop circuit 32 compares in ting between the failing edge of the oscillation inhibit signal 115 and the rising edge of the oscillation clock signals 114, whereby the flip-flop circuit 32 outputs the phase comparison signal 112 which indicates the difference in timing between the falling edge of the oscillation inhibit signal 115 and the rising edge of the oscillation clock signals 114.

The third one of the oscillation clock signals 114 is to be compared with the oscillation inhibit signal 115 but never to be outputted as the multiplication clock signal 117. For this reason, the flip-flop circuit 29 inactivates the mask signal 116 into the low level in response to the falling edge of the second one of the oscillation clock signals 114, whereby the output of the multiplication clock signal 117 is inhibited by the AND-circuit 24.

The rising timing of the third one of the oscillation clock signals 114 may be considered to be the end timing of the second one of the oscillation clock signals 114 or considered to be the final clock of the required multiplication clock signals For this reason it may be considered that the flip-flop circuit 32 compares in end timing between the final clock of the required multiplication clocks and the oscillation period defined by the oscillation control signal 103. Tis is apparent if the delay circuit 31 and a gate delay are ignored, wherein the gate delay is defined from receipt by the oscillator 8 of the oscillation control signal 103 to the output of the first one of the multiplication clock signals 117.

The oscillation control signal 103 is considered to be the oscillation period setting signal externally supplied to the pulse signal generator circuit 1. The flip-flop circuit 32 outputs "1" as the high level when the number of the generated multiplication clock signals 117 is larger than the pre-set multiplication number. The flip-flop circuit 32 outputs "0" as the low level when the number of the generated multiplication clock signals 117 is equal to or smaller than the pre-set multiplication number As the phase of the oscillation clock signal 114 is ahead, then the phase comparison signal 112 is "1" as the high level. As the phase of the oscillation clock signal 114 is delayed, then the phase comparison signal 112 is "0" as the low level. For this reason, the phase comparison signal 112 remains "0" otherwise "1" until the frequency of the generated multiplication clock signals 117 becomes stable. After the frequency of the generated multiplication clock signals 117 have become stable, then the phase comparison signal 112 shows changes between "0" and "1" due to a small variation in frequency of the oscillation clock signal 114.

As described above, the second pulse signal generator circuit 2 is controlled by the oscillation control signal 104 corresponding to the inversion to the oscillation control signal 103 which controls the first pulse signal generator circuit 1. The second pulse signal generator circuit 2 is the same as the first pulse signal generator circuit 2 in operations. The first and second pulse signal generator circuits generate alternately it and second multiplied clock signals for every cycles of the input clock signal.

Figure 11:
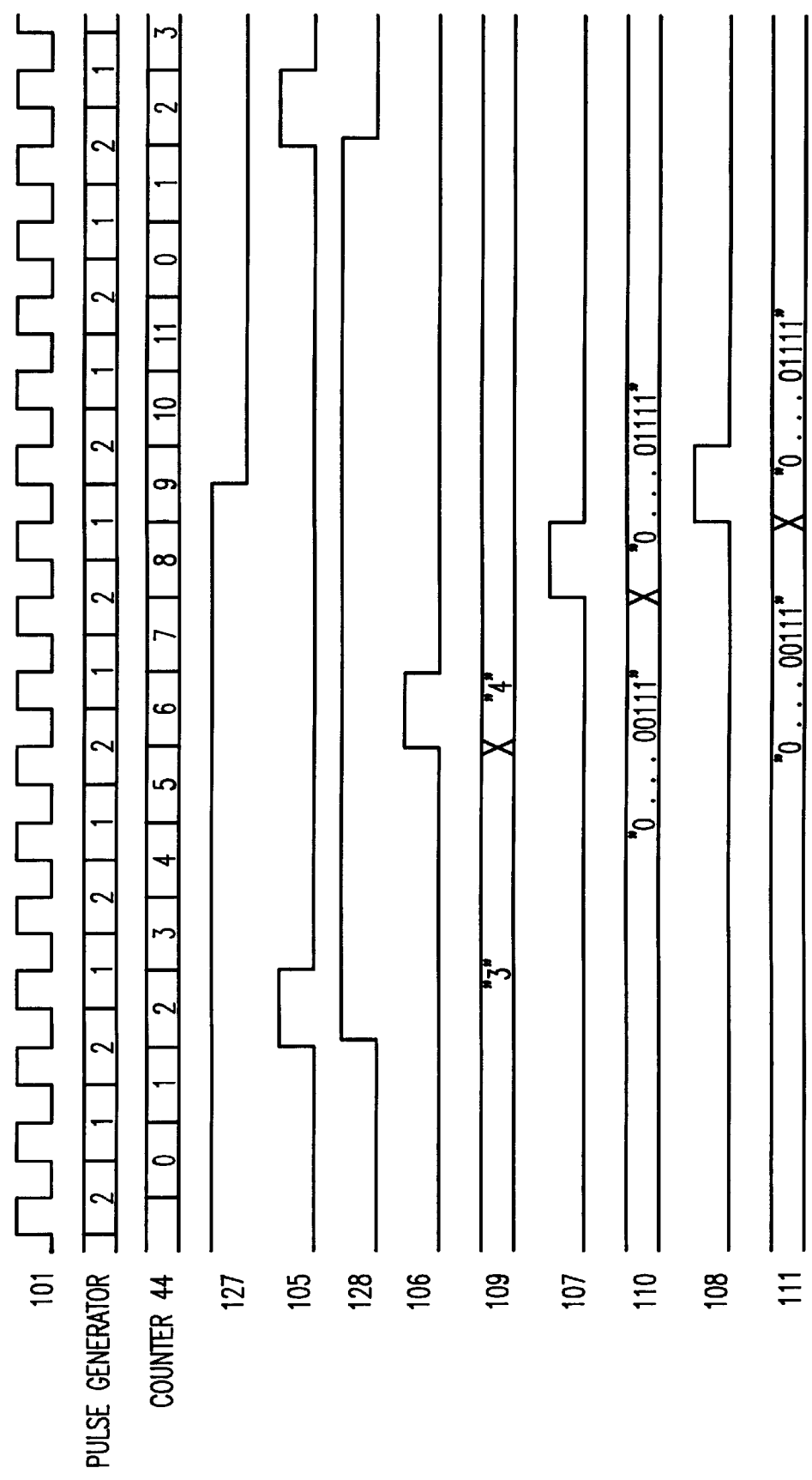
FIG. 11 is a timing chart of the timing control circuit, the counter circuit and the latch circuit in a first novel clock signal frequency multiplier circuit shown in FIG. 2 in the first embodiment in accordance with the present invention.

FIG. 11 is a timing chart of the timing control circuit, the counter circuit and the latch circuit in a first novel clock signal frequency multiplier circuit shown in FIG. 2 in the first embodiment in accordance with the present invention The first and second pulse signal generator circuits generate alternately first and second multiplied clock signals for every cycles of the input clock signal.

If the first and second phase comparison signals 112 and 113 are "1" as the high level, then the phase comparison signal 127 from the AND-circuit 33 is "1" as the high level. When the counted value by the duodecimal counter 44 becomes "2", then the flip-flop circuit 48 generates the up-down control signal 105 and the flip-flop circuit 48 activates the up-down signal 128 into the high level. Assuming that at this time the up-down counter 35 outputs "3" as the count output signal 109, tho following description will be made. When the counted value by the duodecimal counter 44 becomes "6", then the flip-flop circuit 49 generates the counter clock signal 106, whereby the count output signal 109 becomes "4". Further, as the counted value by the duodecimal counter 44 becomes up to "8" and then "9", the flip-flop circuits 50 and 51 generate the latch signals 107 and 108 whereby the counter output signals 109 are outputted from the latch circuits 37 and 38 as the delay control signals 110 and 111. The phase comparison signal 127 becomes low level when the counted value by the duodecimal counter 44 is "9", because a delay time of the delay circuit 23 has become large due to a large value of the delay control signal 110 whereby the phase comparison signal 112 is changed to "0". Therefore, when the counted value by the duodecimal counter 44 becomes "2" in the next time, then the up-down signal 128 becomes low level.

Accordingly, the pulse generation circuit is capable of setting the optional or selectable number of multiplication for control to the oscillation control signal of the oscillator, so as to change the number of the multiplication for generating the various number-multiplied clock signal without increase in the circuit scale of the circuit.

Further, two pulse signal generator circuits are provided so that those two pulse signal generator circuits alternately generate the two output clock signals for every cycles of the input clock signal, whereby the multiplied output clock signal is free from the duty ratio of the input clock signal.

Furthermore, the above multiplier circuit comprises only logic gates so that the circuit is capable of generating the multiplied clock signal with a small fluctuation or jitter but free from the influences of the variation of the process conditions and variation in power voltage level.

Figure 12:
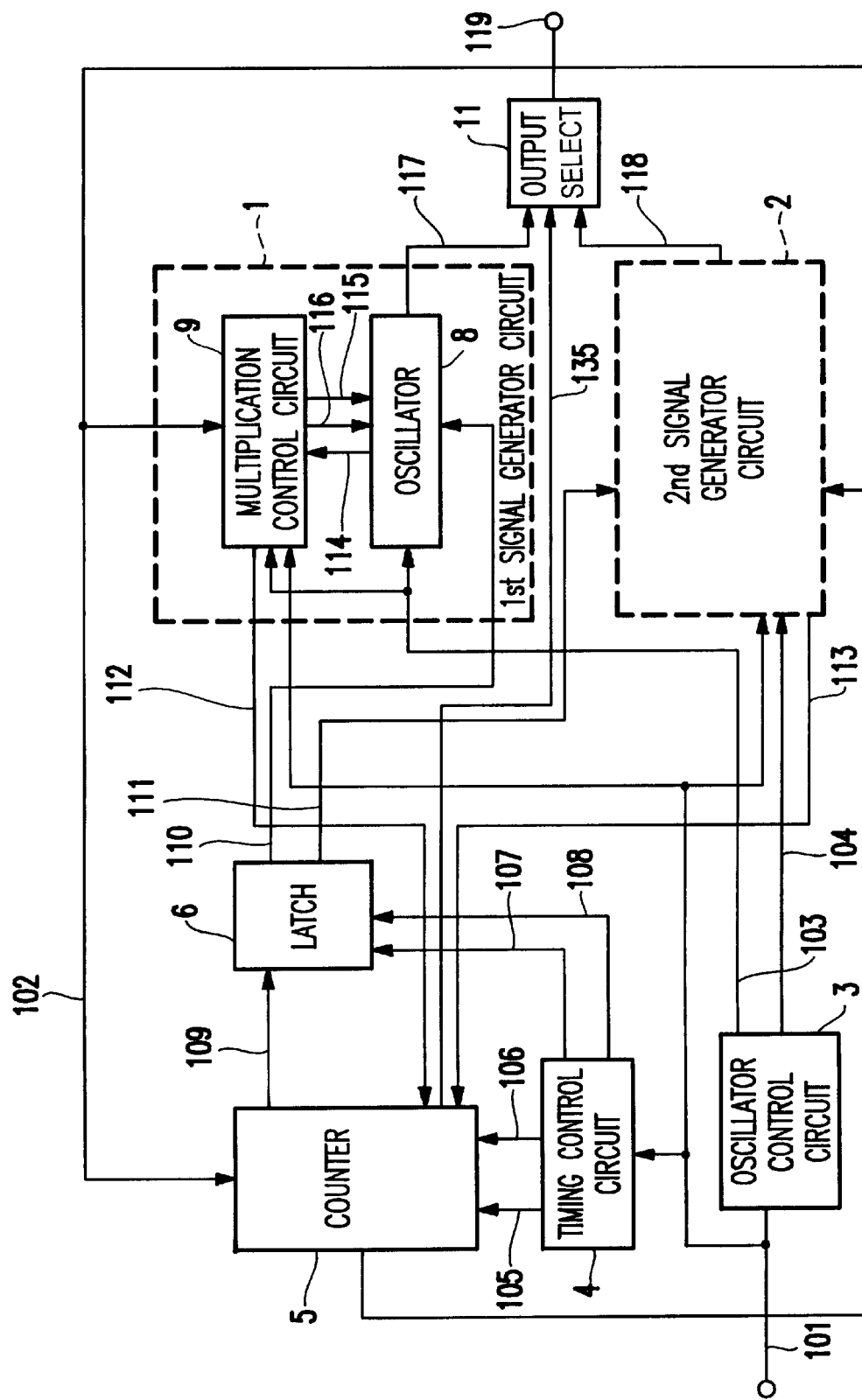
FIG. 12 is a circuit diagram illustrative of a second novel clock signal frequency multiplier circuit in the second embodiment in accordance with the present invention.

A second embodiment according to the present invention will be described in detail. The following description will focus on the differences in circuit configuration and operation of the second novel clock signal frequency multiplier circuit of this embodiment from the first novel clock signal frequency multiplier circuit of the first embodiment, in order to avoid the duplicate descriptions, FIG. 12 is a circuit diagram illustrative of a second novel clock signal frequency multiplier circuit in the second embodiment in accordance with the present invention. A difference in circuit configuration of the second novel clock signal frequency multiplier circuit from the first novel clock signal frequency multiplier circuit is only in providing the output selecting circuit in pace of the OR-circuit.

First and second pulse signal generator circuits 1 and 2 are provided for generating alternately first and second multiplied clock signals for every cycles of an input clock signal, wherein the it multiplied clock signal is generated by the first pulse signal generator circuit 1 for every other cycles of the input clock signals, whilst the second multiplied clock signal is generated by the second pulse signal generator circuit 2 for every other cycles of the input clock signals, so that the first and second multiplied clock signals are generated alternately for every cycles of the input clock signals, An oscillator control circuit 3 is provided which is connected to an input terminal for receiving an input clock signal 101 and generates first and second oscillation control signals 103 and 104 as divided signals, The oscillator control circuit 3 is also connected to the first and second pulse signal generator circuits 1 and 2 for allowing the first and second oscillation control signals 103 and 104 to be transmitted into the first and second pulse signal generator circuits 1 and 2 respectively, whereby the first and second pulse signal generator circuits 1 and 2 are controlled by the first and second oscillation control signals 103 and 104 respectively. The second oscillation control signal 104 is an inversion signal to the first oscillation control signal 103. The first oscillation control signal 103 becomes high level for every other cycles of the input clock signals 101 whilst the second oscillation control signal 104 becomes high level for every other cycles of the input clock signals 101, so that the first and second oscillation control signals 103 and 104 alternately become high levels for every cycles of the input clock signals 101. During when the first oscillation control signal 103 is in the high level, the first pulse signal generator circuit 1 generates the first multiplied clock signal 117. During when the second oscillation control signal 104 is in the high level, the second pulse signal generator circuit 2 generates the second multiplied clock signal 118. Since the first and second oscillation control signals 103 and 104 alternately become high levels for every cycles of the input clock signals 101, the first and second pulse signal generator circuits 1 and 2 generate the first and second multiplied clock signals 117 and 118 alternately for every cycles of the input clock signal 101.

An output selecting circuit 11 is also provided which is connected to both the first and second pulse signal generator circuits 1 and 2 for receiving the first and second multiplied clock signals 117 and 118 to perform the function of selecting one of the first and second multiplied clock signals 117 and 118 and then generate an output clock signal 119 on an output terminal of the first novel clock signal frequency multiplier circuit The first and second pulse signal generator circuits 1 and 2 having the same circuit configuration as each other, wherein each of the first and second pulse signal generator circuits 1 and 2 accommodates an n-multiplication control circuit 9 and an oscillator 8. Operational timing of the oscillator 8 in the first pulse signal generator circuit 1 is controlled by the first oscillation control signal 103, the timing of the other oscillator 8 in the second pulse signal generator circuit 2 is controlled by the second oscillation control signal 104. The n-multiplication control circuit 9 in each of the first and second pulse signal generator circuits 1 and 2 receives a multiplication setting signal 102 so that the n-multiplication control circuit 9 is operated to set information about the desired multiplication number. The n-multiplication control circuit 9 in the first pulse signal generator circuit 1 generates a first phase comparing 112 whilst the n-multiplication control circuit 9 in the second pulse signal generator circuit 2 generates a second phase comparison signal 113.

A timing control circuit 4 is also provided which is connected to the input terminal for receiving the input clock signal 101 and generates an up-down control signal 105, a counter clock signal 106, and first and second latch clock signals 107 and 108.

A counter circuit 5 is also provided which is connected to the timing control circuit 4 for receiving the up-down control signal 105 and the counter clock signal 106. The counter circuit 5 is also connected to the n-multiplication control circuits 9 in the first and second pulse signal generator circuits 1 and 2 for receiving the first and second phase comparison signals 112 and 113 from the n-multiplication control circuits 9 in the first and second pulse signal generator circuits 1 and 2 respectively. The counter circuit 5 generates a counter output signal 109.

A latch circuit 6 is also provided which is connected to the counter circuit 5 for receiving the counter output signal 109. The latch circuit 6 is also connected to the timing control circuit 4 for receiving the first and second latch clock signals 107 and 108, so that operation timing of the latch circuit 6 is controlled by the first and second latch clock signals 107 and 108. The latch circuit 6 generates first and second delay control signals 110 and 111. Tho latch circuit 6 is also connected to the oscillators 8 in the first and second pulse signal generator circuits 1 and 2 for transmitting the first and second delay control signals 110 and 111 to the oscillators 8 in the first and second pulse signal generator circuits 1 and 2 respectively, so that frequencies of the oscillators 8 in the first and second pulse signal generator circuits 1 and 2 are controlled by the first and second pulse signal generator circuits 1 and 2 respectively.

The oscillation frequency of the oscillator 8 is controlled by the 101 is low, then the frequency of the generated multiplied clock signal is also low, for which reason this embodiment is to increase the frequency of the multiplied clock signal to be outputted from the oscillator 8, before the frequency is divided to decrease the frequency for output the output clock signal 119. This means that the acceptable frequency band of the input clock signal 101 is widen.

In the counter circuit 10, when the phase comparison signals 112 and 113 inputted from the first an second pulse signal generator circuits 1 and 2 become satisfying the predetermined conditions, a sequencer provided in the counter circuit 10 makes the multiplication setting signal 12 double or twice of the externally supplied value for subsequent output thereof, whereby the frequencies of the multiplied clock signals 117 and 118 are made double. The output selecting circuit 11 is inputted with a mode selecting signal 135 indicating whether or not the multiplication setting value has been made double. This mode selecting signal 135 is given from the counter circuit 10. If the multiplication setting value has been made double, the multiplied clock signals 117 and 118 are selected to frequency-division for output of the output clock signal 119 having the required frequency.

Figure 13:
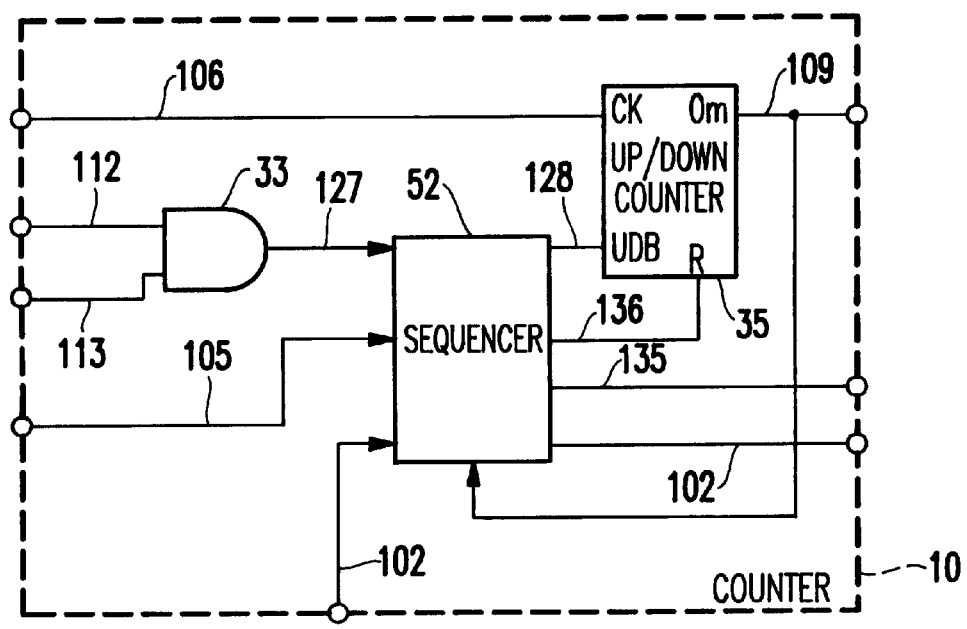
FIG. 13 is a circuit diagram illustrative of a counter circuit in a first novel clock signal frequency multiplier circuit shown in FIG. 12 in the second embodiment in accordance with the present invention.

FIG. 13 is a circuit diagram illustrative of a counter circuit in a so second novel clock signal frequency multiplier circuit shown in FIG. 12 in the second embodiment in accordance with the present invention. The counter circuit 10 comprises an AND-circuit 33, a sequencer 52 and an up-down counter 35. The sequencer 52 receives inputs of the phase comparison signal 127 and the up-down control clock signal 105. The sequencer 52 accommodates a shift resistor for latching the level of the phase comparison signal 127 upon the up-down control clock signal 105. When the levels of the phase comparison signals 127 latched by the shift resistor accommodated in the sequencer 52 become satisfying the predetermined conditions, then the counted value of the counter output signal 109 is confirmed. If the counted value is above the predetermined value, then the sequencer 52 makes the inputted multiplication setting signal 102 double for subsequent output thereof thereby activating the mode selecting signal 135 into the high level. Further, the sequencer 52 outputs the reset signal 136 to the up-down counter 35, whereby the up-down counter 35 is initialized to the maximum value.

If the counted value is below the predetermined value, the multiplication setting signal 102 is directly outputted to inactivate the mode setting signal into the low level. The level of the phase comparison signal 127 is outputted as the up-down signal 128 in response to the rising edge of the up-down control clock signal 105.

Conditions for setting the phase comparison signal 127 are set when the phase comparison signal 127 is changed from "0" to "1" However, any modification is available. Further, it is possible that the counter output signal 109 to be inputted into the sequencer 52 comprises the lower significant bits only.

Figure 14:
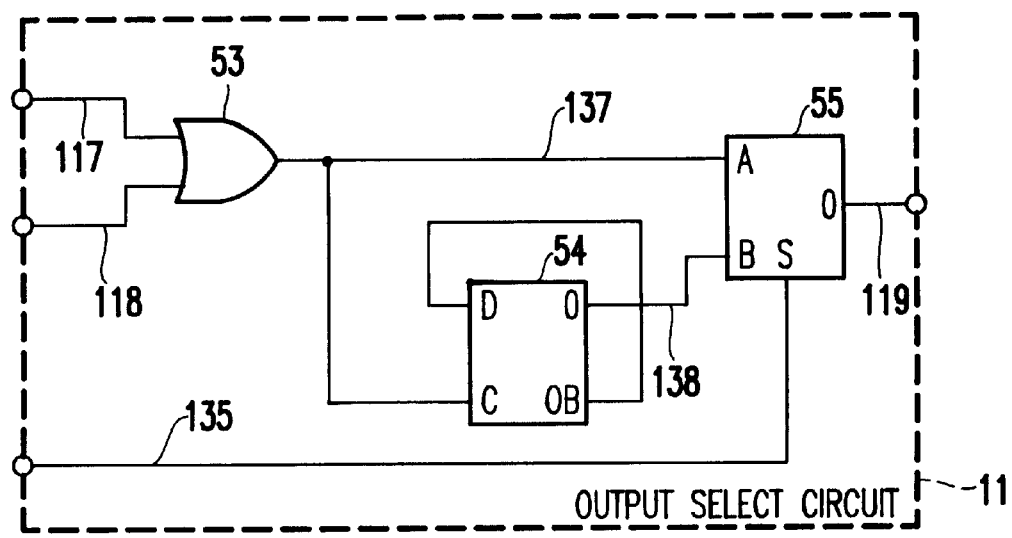
FIG. 14 is a circuit diagram illustrative of an output selecting circuit in a second novel clock signal frequency multiplier circuit shown in FIG. 12 in the second embodiment in accordance with the present invention.

FIG. 14 is a circuit diagram illustrative of an output selecting circuit in a second novel clock signal frequency multiplier circuit shown in FIG. 12 in the second embodiment in accordance with the present invention. The output selecting circuit 11 comprises an OR-circuit 53, a frequency-divider 54 and a multiplexer 55. The multiplied clock signals 117 and 118 are inputted into the output selecting circuit 11 and then subjected to the logical OR operation by the OR-circuit 53, whereby the OR-circuit 53 generates the multiplied clock signal 137. This multiplied clock signal 137 is then transmitted to an input terminal "A" of the multiplexer 55 and separately transmitted into the frequency-divider 54 so that the multiplied clock signal 137 is frequency-divided by the frequency-divider 54 into the frequency-divided clock signal 138. Tis frequency-divided clock signal 138 is inputted into an input terminal "B" of the multiplexer 55 so that the multiplexer 55 selects the multiplication clock signal 137 as the output clock signal 119 when the mode selecting signal 135 is in the low level. If the mode selecting signal 135 is in the high level, then the multiplexer 55 selects the frequency-divided clock signal 138 as the output clock signal 119.

Accordingly, the pulse generation circuit is capable of setting the optional or selectable number of multiplication for control to the oscillation control signal of the oscillator, so as to change the number of the multiplication for generating the various number-multiplied clock signal without increase in the circuit scale of the circuit.

Further, two pulse signal generator circuits are provided so that those two pulse signal generator circuits alternately generate the two output clock signals for every cycles of the input clock signal, whereby the A multiplied output clock signal is free from the duty ratio of the input clock signal.

Furthermore, the above multiplier circuit comprises only logic gates so that the circuit is capable of generating the multiplied clock signal with a small fluctuation or jitter but free from the influences of the variation of the process conditions and variation in power voltage level.

A third embodiment according to the present invention will be described in detail. The following description will focus on the differences in circuit configuration and operation of the third novel clock signal frequency multiplier circuit of this embodiment from the second novel clock signal frequency multiplier circuit of the second embodiment, in order to avoid the duplicate descriptions.

Figure 15:
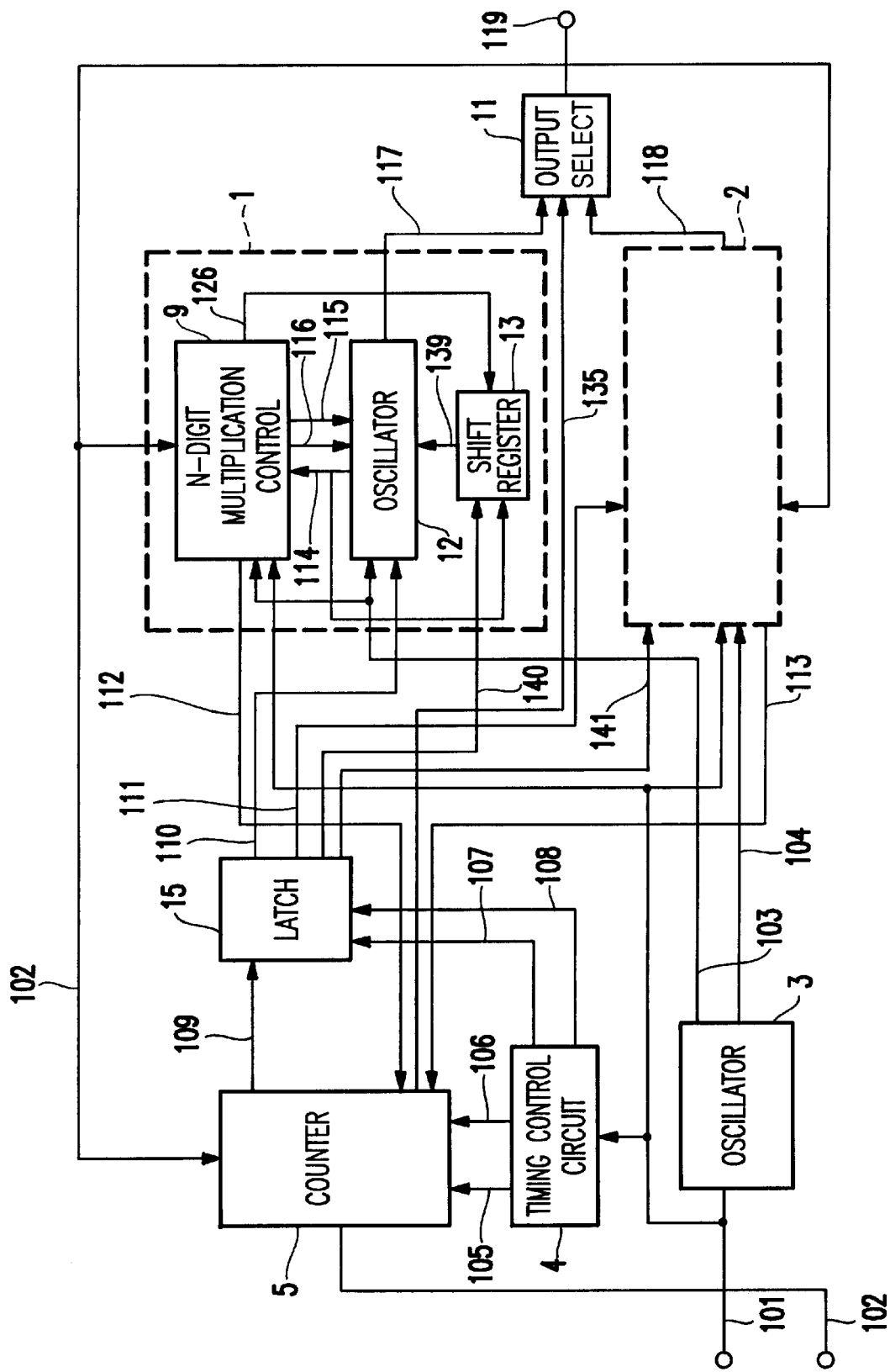
FIG. 15 is a circuit diagram illustrative of a third novel clock signal frequency multiplier circuit in the third embodiment in accordance with the present invention.

FIG. 15 is a circuit diagram illustrative of a third novel clock signal frequency multiplier cut in the third embodiment in accordance with the present invention. A difference in circuit configuration of the third novel clock signal frequency multiplier circuit from the second novel clock signal frequency multiplier circuit is in providing a different oscillator 12 and a shift resistor 13 and an n-digit multiplication control circuit 9 in each of the two pulse signal generators.

First and second pulse signal generator circuits 1 and 2 are provided for generating alternately first and second multiplied clock signals for every cycles of an input clock signal, wherein the first multiplied clock signal is generated by the first pulse signal generator circuit 1 for every other cycles of the input clock signals, whilst the second multiplied clock signal is generated by the second pulse signal generator circuit 2 for every other cycles of the input clock signals, so that the first and second multiplied clock signals are generated alternactly for every cycles of the input clock signals.

An oscillator control circuit 3 is provided which is connected to an input terminal for receiving an input code signal 101 and generates first and second oscillation control signals 103 and 104 as divided signals. The oscillator control circuit 3 is also connected to the first and second pulse signal generator circuits 1 and 2 for allowing the first and second oscillation control signals 103 and 104 to be transmitted into the first and second pulse signal generator circuits 1 and 2 respectively, whereby the first and second pulse signal generator circuits 1 and 2 arm controlled by the first and second oscillation control signals 103 and 104 respectively. The second oscillation control signal 104 is an inversion signal to the first oscillation control signal 103. The first oscillation control signal 103 becomes high level for every other cycles of the it clock signals 101 whilst the second oscillation control signal 104 becomes high level For every other cycles of the input clock signals 101, so that the first and second oscillation control signals 103 and 104 alternately become high levels for every cycles of the input clock signals 101. During when the first oscillation control signal 103 is in the high level, the first pulse signal generator circuit 1 generates the first multiplied clock signal 117. During when the second oscillation control signal 104 is in the high level, the second pulse signal generator circuit 2 generates the second multiplied clock signal 118. Since the first and second oscillation control signals 103 and 104 alternately become high levels for every cycles of the input clock signals 101, the first and second pulse signal generator circuits 1 and 2 generate the first and second multiplied clock signs 117 and 118 alternately for every cycles of the input clock signal 101.

An output selecting circuit 11 is also provided which is connected to both the first and second pulse signal generator circuits 1 and 2 for receiving the first and second multiplied clock signals 117 and 118 to perform the function of selecting one of the first and second multiplied clock signals 117 and 118 and then generate an output clock signal 119 on an output terminal of the first novel clock signal frequency multiplier circuit.

The first and second pulse signal generator circuits 1 and 2 having the same circuit configuration as each other, wherein each of the first and second pule signal generator circuits 1 and 2 accommodates an n-multiplication control circuit 9 and an oscillator 12 as well as a shift resistor 13. Operational timing of the oscillator 8 in the first pulse signal generator circuit 1 is controlled by the first oscillation control signal 103, the timing of the other oscillator 8 in the second pulse signal generator circuit 2 is controlled by the second oscillation control signal 104. The n-multiplication control circuit 9 in each of the first and second pulse signal generator circuits 1 and 2 receives a multiplication setting signal 102 so that the n-multiplication control circuit 9 is operated to set information about the desired multiplication number. The n-multiplication control circuit 9 in the first pulse signal generator circuit 1 generates a first phase comparison signal 112 whilst the n-multiplication control circuit 9 in the second pulse signal generator circuit 2 generates a second phase comparison signal 113. This circuit configuration is to do a highly accurate adjustment to the clock width of the multiplied clock signals 117 and 118 so as to reduce the fluctuation or jitter. A clock width adjustment signal 139 is supplied from the shift resistor 13 to the oscillator 12 for adjustment to the clock pulse width of the oscillation clock signal 114. The shift resistor 13 in each of the first and second pulse signal generator circuits 1 and 2 also receives the counter output signal 140 or 141 having been transmitted from the latch circuit 15, wherein the counter output signal 140 or 141 represents the latched value of the lower significant bits of the counter output signal 109.

A timing control circuit 4 is also provided which is connected to the input terminal for receiving the input clock signal 10 and generates an up-down control signal 105, a counter clock signal 106, and first and second latch clock signals 107 and 108.

A counter circuit 5 is also provided which is connected to the timing control circuit 4 for i receiving the up-down control signal 105 and the counter clock signal 106. The counter circuit 5 is also connected to the n-multiplication control circuits 9 in the first and second pulse signal generator circuits 1 and 2 for receiving the first and second phase comparison signals 112 and 113 from the n-multiplication control circuits 9 in the first and second pulse signal generator circuits 1 and 2 respectively. The counter circuit 5 generates a counter output signal 109.

A latch circuit 6 is also provided which is connected to the counter circuit 5 for receiving the counter output signal 109. The latch circuit 6 is also connected to the timing control circuit 4 for receiving the first and second latch clock signals 107 and 108, so that operation timing of the latch circuit 6 is controlled by the first and second latch clock signal 107 and 108. The latch circuit 6 generates first and second delay control signals 110 and 111. The latch circuit 6 is also connected to the oscillators 8 in the first and second pulse signal generator circuits 1 and 2 for transmitting the first and second delay control signals 110 and 111 to the oscillators 8 in the first and second pulse signal generator circuits 1 and 2 respectively, so that frequencies of the oscillators 8 in the first and second pulse signal generator circuits 1 and 2 are controlled by the first and second pulse signal generator circuits 1 and 2 respectively.

The oscillation frequency of the oscillator 8 is controlled by the delay time of the delay at 23. If the frequency of the input clock signal 101 is low, then the frequency of the generated multiplied clock signal is also low, for which reason this embodiment is to increase the frequency of the multiplied clock signal to be outputted from the oscillator 8, before the frequency is divided to decrease the frequency for output the output clock signal 119. This means that the acceptable frequency band of the input clock signal 101 is widen.

In the counter circuit 10, when the phase comparison sis 112 and 113 inputted from the first and second pulse si generator circuits 1 and 2 become satisfying the predetermined conditions, a sequencer provided in the counter circuit 10 makes the multiplication setting signal 12 double or twice of the externally supplied value for subsequent output thereof, whereby the frequencies of the multiplied clock signals 117 and 118 are made double. The output selecting circuit 11 is inputted with a mode selecting signal 135 indicating whether or not the multiplication setting value has been made double. This mode selecting signal 135 is given from the counter circuit 10. If the multiplication setting value has been made double, the multiplied clock signals 117 and 118 are subjected to frequency-division for output of the output clock signal 119 having the required frequency.

Figure 16:
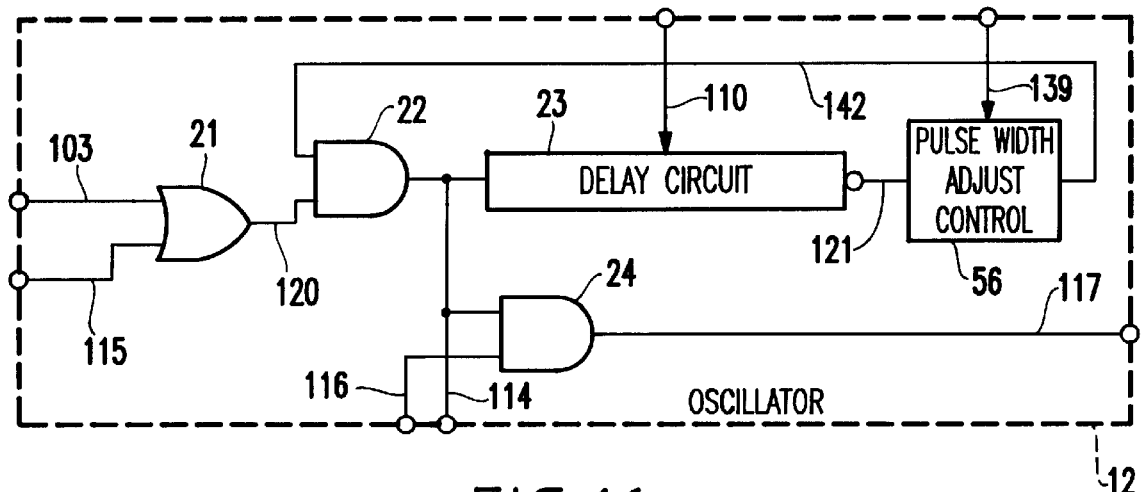
FIG. 16 is a circuit diagram illustrative of an oscillator in each of first and second pulse signal generator circuits in a third novel clock signal frequency multiplier circuit shown in FIG. 15 in the third embodiment in accordance with the present invention.

FIG. 16 is a circuit diagram illustrative of an oscillator in each of first and second pulse signs generator circuits in a third novel clock signal frequency multiplier circuit shown in FIG. 15 in the third embodiment in accordance with the present invention. The oscillator 12 in the first pulse signal generator circuit 1 is operated to generate a first oscillation clock signal 114 upon input of the first oscillation control signal 103 into the oscillator 8 in the first pulse signal generator circuit 1. The oscillator 12 in the second pulse signal generator circuit 2 is operated to generate a second oscillation clock signal upon input of the second oscillation control signal 104 into the oscillator 12 in the second pulse signal generator circuit 2 Since the oscillator 12 in the first pulse signal generator circuit 1 has the same circuit configuration as the oscillator 12 in the second pulse signal generator circuit 2, then the following description will focus on the oscillator 8 in the first pulse signal generator circuit 1. The oscillator 8 comprises an OR-circuit 21, first and second AND-circuits 22 and 24 and a delay circuit 23. The OR circuit 21 has two input terminals for id the first oscillation control signal 103 and an oscillation inhibit signal 115. The OR-circuit 21 performs the function of logical sum or "OR-operation" of the first oscillation control signal 103 and the oscillation inhibit signal 115, So that if the first oscillation control signal 103 is in the high level, then the OR-circuit 21 performs output of an oscillation enable signal 120 in high level. The first AND circuit 22 has two inputs connected to both the output of the OR-circuit 21 and an output of the delay circuit 23 for receiving the oscillation enable signal 120 from the OR-circuit 21 and an inverted delay signal from the delay it 23. The first AND circuit 22 outputs an oscillation clock signal 114 which repeats high and low levels during when the oscillation enable signal 120 is in the high level The output side of the first AND circuit 22 is farther connected to the n-multiplication control circuit 9 for transmitting the oscillation clock signal 114 to the n-multiplication control circuit 9. The delay circuit 23 is also connected to the output side of the first AND circuit 22 for receiving the oscillation clock signal 114. The delay circuit 23 is also connected to the latch circuit 6 for receiving the first delay control signal 110 to change the number of the stage of the delay circuit 23. The delay circuit 23 generates an inverted delay signal 121 which corresponds to inverted levels to the oscillation clock signal 114. A pulse width adjustment circuit 56 is also provided which is connected to the delay cut 23 for receiving the inverted delay signal 121 so as to do a highly accurate adjustment to the clock width of the inverted clock signal 121 thereby outputting an inverted delay signal 142. The pulse width adjustment circuit 56 also receives a pulse width adjustment signal 139 from the shift resistor 13 so that the pulse width adjustment circuit 56 is controlled by the pulse width adjustment signal 139. The inverted delay signal 142 is fed back to the AND-circuit 22. The second AND circuit 24 has two inputs which are connected to the output of the first AND at 22 and the n-multiplication control circuit 9 for receiving the oscillation clock signal 114 from the first AND circuit 22 and a mask signal 116 from the n-multiplication control circuit 9. The second AND it 24 outputs the first multiplication clock signal 117 as an output signal from the first pulse signal generator 1 so that the first multiplication clock signal 117 is transmitted to the OR-circuit 7. During when the first oscillation control signal 103 is in the high level, the first pulse signal generator circuit 1 generates the first multiplied clock signal 117. During when the second oscillation control signal 104 is in the high level, the second pulse signal generator circuit 2 generates the second multiplied clock signal 118. Since the first and second oscillation control signals 103 and 104 alternately become high levels for every cycles of the input clock signals 101, the first and second pulse signal generator circuits 1 and 2 generate the first and second multiplied clock signals 117 and 118 alternately for every cycles of the input clock signal 101.

Figure 17:
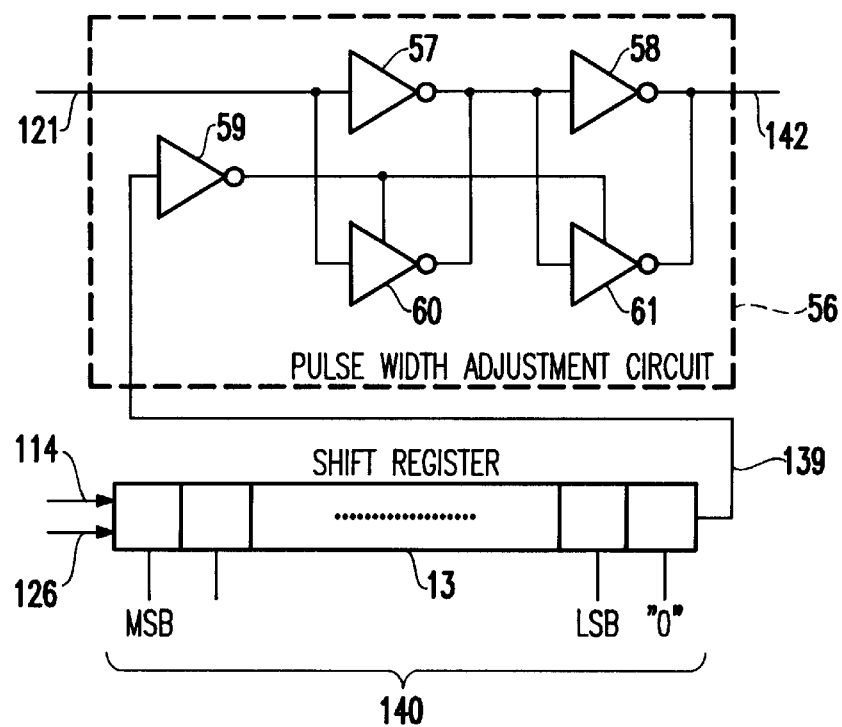
FIG. 17 is a circuit diagram illustrative of a pulse width adjustment circuit and a shift resistor in each of first and second pulse signal generator circuits in a third novel clock signal frequency multiplier circuit shown in FIG. 15 in the third embodiment in accordance with the present invention.

FIG. 17 is a circuit diagram illustrative of a pulse width adjustment circuit and a shift resistor in each of first and second pulse signal generator circuits in a third novel clock signal frequency multiplier circuit shown in FIG. 15 in the third embodiment in accordance with the present invention. The shift resistor fetches a counter output signal 140 in response to the rising edge of the counter set signal 126 supplied from the n-digit multiplication control signal 9, wherein the low level "0" is captured into the lowest significant bit of the shift resistor 13. The digits are shifted by one bit in response to the rising edge of the oscillation clock signal supplied from the oscillator 12 thereby outputting the pulse width adjustment signal 139. During when the oscillator 12 is in the oscillation intuit state, a value of the counter output signal 140 is set to the shift resistor 13. In this state, the lowest significant bit value "0" is outputted as the pulse width adjustment signal 139. The lowest significant bit value of the counter output signal 140 is outputted as the pulse width adjustment signal 139 in response to the first clock of the oscillation clock signal 114.

The pulse signal width adjustment circuit 56 transmits the inverted delay signal 142 adjusted in pulse width by use of the clocked inventors 60 and 61 and the inverters 57 and 58 when the pulse width adjustment signal 139 is low level. The apparent driving power is increased due to parallel operations of the inventors and clocked inventors, whereby almost no delay is caused. If the pulse width adjustment signal 139 is high level, then the inverted delay signal is transmitted by only the inventors 57 and 58, whereby the inverted delay signal 142 is slightly delayed as compared to the inverted delay signal 121. In this embodiment, the pulse width adjustment circuit 56 adjusts the delay at about 100 ps.

The operation of the up-down counter 62 provided in the counter circuit 14 is different from the first and second embodiments.

Figure 18:
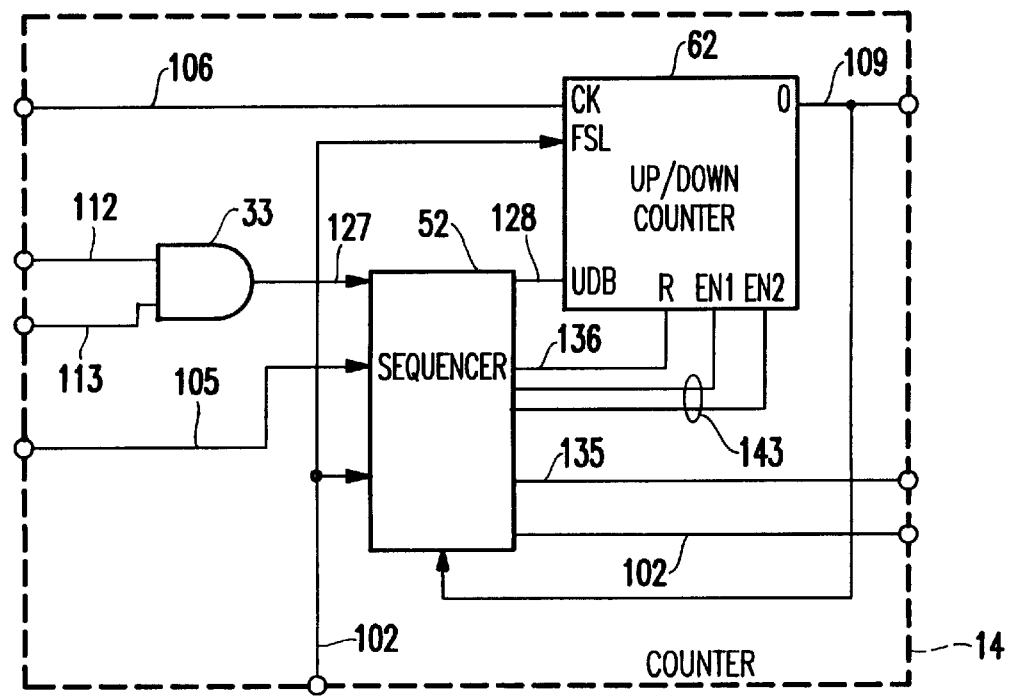
FIG. 18 is a circuit diagram illustrative of a counter circuit in a third novel clock signal frequency multiplier circuit shown in FIG. 15 in the third embodiment in accordance with the present invention.
Figure 19:
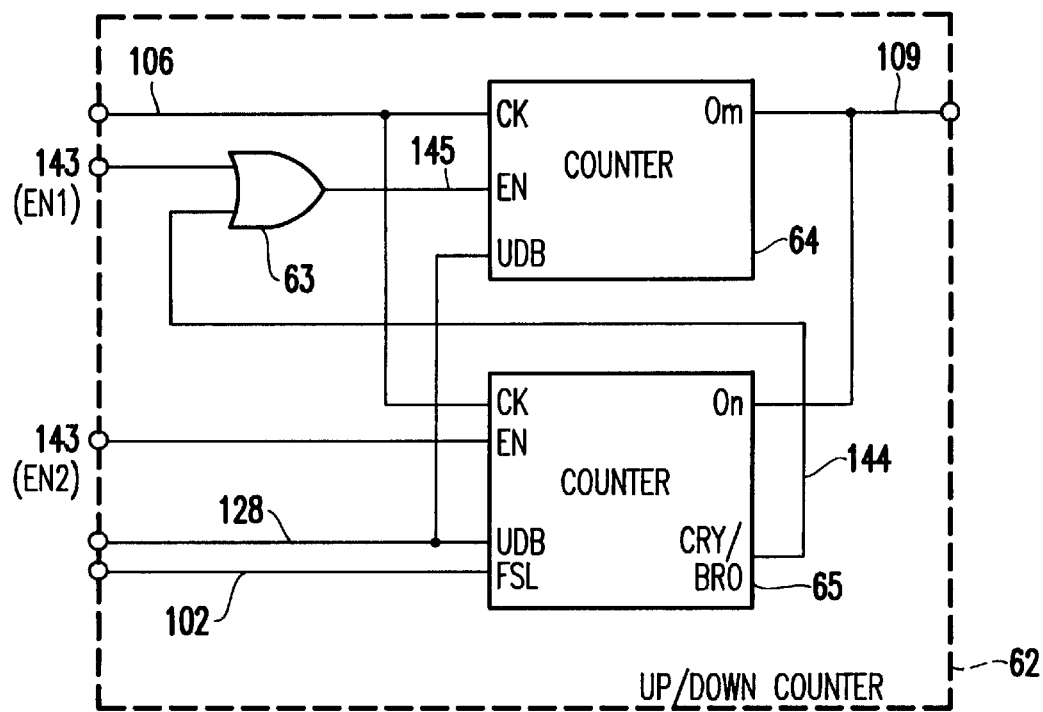
FIG. 19 is a circuit diagram illustrative of an up-down counter shown in FIG. 18 in the counter circuit in a third novel clock signal frequency multiplier circuit shown in FIG. 15 in the third embodiment in accordance with the present invention.

FIG. 18 is a circuit diagram illustrative of a counter circuit in a third novel clock signal frequency multiplier circuit shown in FIG. 15 in the third embodiment in accordance with the present invention. The counter circuit 10 comprises an AND-circuit 33, a sequencer 52 and an up-down counter 62. FIG. 19 is a circuit diagram illustrative of an up-down counter shown in FIG. 18 in the counter circuit in a third novel clock signal frequency multiplier circuit shown m FIG. 15 in the third embodiment in accordance with the present invention. The counters 64 and 65 are operated under the control by a counter enable signal 143. The sequencer 52 first outputs a reset signal to the up-down counter 62 for initializations to the counters 64 and 65. The counter 64 is in the higher significant side whilst the counter 65 is in the lower significant side. The counter 64 is initialized to the maximum value (11111-11) whilst the counter 65 is initialized to the maximum value (0000-00). In FIG. 19, illustration of the reset signal 136 is omitted.

Oscillation of the oscillation clock signal 114 is started whereby the sequencer 52 activates the counter enable signal 143 (EN1) into the high level and inactivates the other counter enable signal 143 (EN2) into the high level so as to operate the up-down counter 64 in the higher significant side thereby confirming the phase comparison signals 112 and 113 for judging whether or not the frequencies of the first and second multiplied clock signals 117 and 118 have become stable. For example, if the phase comparison signals 112 and 113 are changed in level from "0" to "1", then the frequency becomes stable. If the frequencies of the first and second multiplied clock signals 117 and 118 have become locked, then the counter enable signal 143 (EN1) becomes low level whilst the other counter enable signal 143 (EN2) becomes high level so as to operate the up-down counter in the lower significant side.

When a carry or a bolo appears in the counting operation, a carry/bolo signal 144 is activated into the high level, whereby the OR-circuit 63 activates the counter enable signal 145 into the high level, so that the up-down counter 64 in the higher significant side captures the up-down signal 128 to perform the counting operation. The up-down counter 65 in the lower significant side performs the counting operation but under the control to the countable maximum number by the multiplication setting signal 102. If the multiplication setting signal represents the multiplication "2", then the up-down counter 65 is permitted to perform counting "0" and "1". If the multiplication setting signal represents the multiplication "3", then the up-down counter 65 is permitted to perform counting "0", "1" and "2".

As described above, the lower significant bit of the counter output signal 109 remains (000-00) until the frequencies of the first and second multiplied clock . 117 and 118 become locked After the frequencies of the first and second multiplied clock signals 117 and 118 have become locked, then the counter output signal 109 is outputted as in the first and second embodiments. Namely, no adjustment is made for the clock width by the pulse width adjustment circuit 56 until the frequencies of the first and second multiplied code signals 117 and 118 have become stable.

Figure 20:
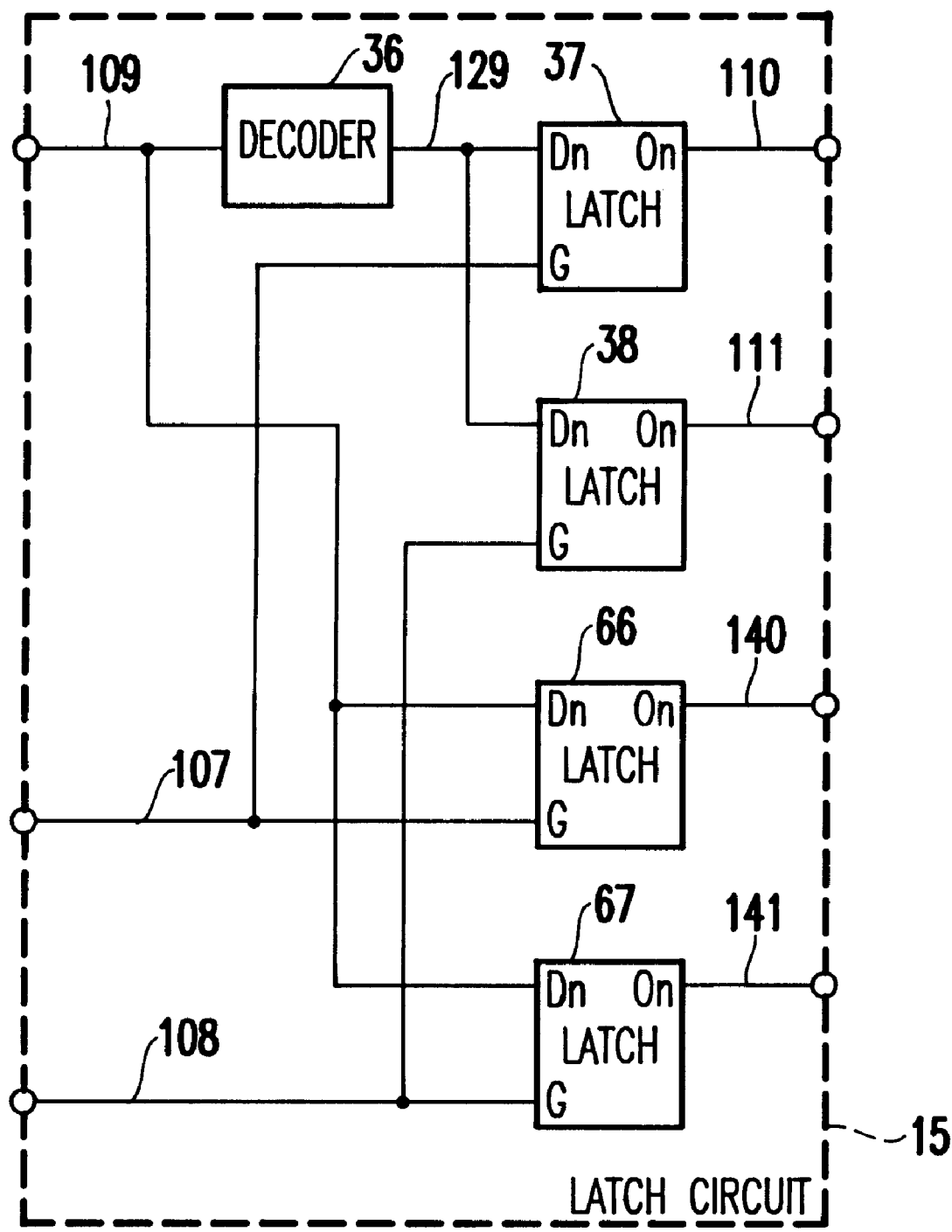
FIG. 20 is a circuit diagram illustrative of a latch circuit in a third novel clock signal frequency multiplier circuit shown in FIG. 15 in the third embodiment in accordance with the present invention.

FIG. 20 is a circuit diagram illustrative of a latch circuit in a third novel clock signal frequency multiplier circuit shown in FIG. 15 in the third embodiment in accordance with the present invention. As compared to the latch circuit in the first and second embodiments, the latch circuit 15 of this third embodiment is provided with latch circuits 66 and 67 for latching the lower significant bits of the counter output signal 109. The latch its 66 and 67 perform latch rations under the latch clock signal 107 and 108.

The latch circuit 15 shows the following operations when the counter output signal 109 is changed. As illustrated in FIG. 11, if the counted value of the counter output signal 109 is changed from "3" to "4", then the count output signal 140 from the latch circuit 15 is changed from (00000011) into (00000100).

The following conditions will be set for convenience of the explanation. The number of multiplication is 2. The one cycle of the input clock signal 101 is 10 nanoseconds. The delay time of the pulse width adjustment cit 56 is 0.1 nanometers. The one cycle of the multiplied clock signal 117 at the counted value "3" is 4.9 nanoseconds. The one cycle of the multiplied clock signal 117 at the counted value "4" is 5.0 nanoseconds. Under those conditions, if the pulse width adjustment circuit 56 were not provided, then two cycles of the multiplied clock s 117 at the counted value "3" is 9.8 nanoseconds. The lowest significant two bits of the count output signal 140 are (11), whereby the cycles are adjusted to (4.9+0.1)×2=10 nanoseconds. If the counted value is "4", no adjustment is made for the pulse width by the lowest significant two bits of the count output signal 140, whereby the cycles are adjusted to 5.0×2=10 nanoseconds. The cycle is adjusted for every clocks of the oscillation clock signal 114 in order to reduce the fluctuations or jitters of the first and second multiplied clock signals 117 and 118.

Accordingly, the pulse generation circuit is capable of setting the optional or selectable number of multiplication for control to the oscillation control signal of the oscillator, so as to change the number of the A multiplication for generating the various number-multiplied clock signal without increase in the circuit scale of the circuit.

Further, two pulse signal generator circuits are provided so that those two pulse signal generator circuits alternately generate the two output clock signals for every cycles of the input clock signal whereby the multiplied output clock signal is free from the duty ratio of the input clock signal.

Furthermore, the above multiplier circuit comprises only logic gates so that the circuit is capable of generating the multiplied clock signal with a small fluctuation or jitter but free from the influences of the variation of the process conditions and variation in power voltage level.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention

What is claimed is:

1. A multiplying circuit comprising
an oscillation control circuit for alternately activating first and second oscillation control signals for every clock cycle of an input clock signal;
a first pulse signal generator circuit connected to said oscillation control circuit for receiving said first oscillation control signal so that said first pulse signal generator circuit generates a first multiplied clock signal having a higher frequency than said input clock signal only when said first oscillation control signal is in an activated state, said first pulse signal generator circuit having a capability to shift said first multiplied clock signal to match a phase of said input clock signal;
a second pulse signal generator circuit connected to said oscillation control circuit for receiving said second oscillation control signal so that said second pulse signal generator circuit generates a second multiplied clock signal having a higher frequency than said input clock signal only when said second oscillation control signal is in an activated state, said second pulse signal generator circuit having a capability to shift said second multiplied clock signal to match a phase of said input clock signal; and
an output circuit connected to said first and second pulse signal generator circuits for receiving said first and second multiplied clock signals and selectively outputting said first and second multiplied clock signals as a multiplied output clock signal.

2. The multiplying circuit as claimed in claim 1, wherein each of said first and second pulse signal generator circuits has a multiplication control circuit which receives a multiplication setting signal externally supplied so that said clock signal is multiplied by a multiplication number defined by said multiplication setting signal thereby outputting said first and second multiplied clock signals from said first and second pulse signal generator circuits respectively.

3. The multiplying circuit as claimed in claim 2, wherein said output circuit performs a function of logical OR of said first and second multiplied clock signals to output said multiplied output clock signal.

4. The multiplying circuit as claimed in claim 2, wherein said output circuit performs functions of frequency-division and subsequent logical OR of said first and second multiplied clock signals to output said multiplied output clock signal.

5. The multiplying circuit as claimed in claim 2, wherein first and second clock numbers of said first and second multiplied clock signals are made to correspond to first and second multiplication numbers presented by said multiplication setting signal during one cyclic period of said input clock signal.

6. The multiplying circuit as claimed in claim 1, wherein each of said first and second pulse signal generator its comprises:
   an oscillator connected to said oscillation control circuit for receipt of said first oscillation control signal so that said oscillator generates an oscillation clock signal as a multiplication clock signal under control by said first oscillation control signal; and
   a multiplication control circuit connected to said oscillation control circuit for receipt of said first oscillation control signal and also connected to said oscillator for receipt of said oscillation clock signal and a multiplication setting signal externally supplied so that when said oscillation clock signal is generated which has a multiplication number presented by said multiplication setting signal, said multiplication control circuit generates an oscillation inhibit signal which is transmitted to said oscillator whereby said oscillator is inhibited to generate said oscillation clock signal.

7. The multiplying circuit as claimed in claim 6, wherein said multiplication control circuit performs comparison in end timing between one cyclic period of said input clock signal and a period of a multiplication oscillation by said oscillation clock signal, so that if said oscillation clock signal is advanced in phase as compared to said input clock signal, then said multiplication control circuit generates a first level phase comparison signal, and if said oscillation clock signal is delayed in phase as compared to said input clock signal, then said multiplication control circuit generates a second level phase comparison signal, and wherein said oscillator reduces a frequency of said oscillation clock signal upon receipt of said first level phase comparison signal, whilst said oscillator increases a frequency of said oscillation clock signal upon receipt of said second level phase comparison signal.

8. The multiplying circuit as claimed in claim 7, wherein said oscillator comprises plural stages of delay circuits connected in series to each other so that said oscillator is increased in a number of said stages upon receipt of said first level phase comparison signal, whilst said oscillator is decreased in a number of said stages upon receipt of said second level phase comparison signal.

9. The multiplying circuit as claimed in claim 6, wherein said oscillator has a pulse width adjustment circuit for adjusting clock width of each clock pulse of said oscillation clock signal.

10. A multiplying circuit comprising:
    an oscillation control circuit for alternately activating a plurality of oscillation control signals for every clock cycle of an input clock signal;
    a plurality of pulse signal generator circuits individually corresponding to said oscillation control signals connected to said oscillation control circuit for allowing each of said pulse signal generator circuits to receive corresponding one of said oscillation control signals so that each of said pulse signal generator circuit performs to generates an individual multiplied clock signal having higher frequencies than said input clock signal only when said corresponding one of said oscillation control signals is in an activated state, each of said plurality of pulse signal generator circuits having a capability to shift said individual multiplied clock signal to match a phase of said input clock signal; and
    an output circuit connected to said pulse signal generator circuits for receiving said individual multiplied clock signals from said pulse signal generator circuits and selectively outputting said multiplied clock signals as a multiplied output clock signal.

11. The multiplying circuit as claimed in claim 10, wherein said plurality of pulse signal generator circuits comprises:
    a first pulse signal generator circuit connected to said oscillation control circuit for receiving said first oscillation control signal so that said first pulse signal generator circuit generates a first multiplied clock signal having a higher frequency than said input clock signal only when said first oscillation control signal is in an activated state; and
    a second pulse signal generator circuit connected to said oscillation control circuit for receiving said second oscillation control signal so that said second pulse signal generator cot generates a second multiplied clock signal having a higher frequency than said input clock signal only when said second oscillation control signal is in an activated state.

12. The multiplying circuit as claimed in claim 11, wherein each of said first and second pulse signal generator circuits has a multiplication control circuit which receives a multiplication setting signal externally supplied so that said clock signal is multiplied by a multiplication number defined by said multiplication setting signal thereby outputting said first and second multiplied clock signals from said first and second pulse signal generator circuits respectively.

13. The multiplying circuit as claimed in claim 12, wherein said output circuit performs a function of logical OR of said first and second multiplied clock signals to output said multiplied output clock signal.

14. The multiplying circuit as claimed in claim 12, wherein said output circuit performs functions of frequency division and subsequent logical OR of said first and second multiplied clock signals to output said multiplied output clock signal.

15. The multiplying circuit as claimed in claim 12, wherein first and second clock numbers of said first and second multiplied clock signals are made to correspond to first and second multiplication numbers presented by said multiplication setting signal during one cyclic period of said input clock signal.

16. The multiplying circuit as claimed in claim 11, wherein each of said first and second pulse signal generator circuits comprises:

an oscillator connected to said oscillation control circuit for receipt of said first oscillation control signal so that said oscillator generates an oscillation clock signal as a multiplication clock signal under control by said first oscillation control signal; and a multiplication control circuit connected to said oscillation control circuit for receipt of said first oscillation control signal and also connected to said oscillator for receipt of said oscillation clock signal and a multiplication setting signal externally supplied so that when said oscillation clock signal is generated which has a multiplication number presented by said multiplication setting signal, said multiplication control circuit generates an oscillation inhibit signal which is transmitted to said oscillator whereby said oscillator is inhibited to generate said oscillation clock signal.

17. The multiplying circuit as claimed in claim 16, wherein said multiplication control circuit performs comparison in end timing between one cyclic period of said input clock signal and a period of a multiplication oscillation by said oscillation clock signal, so that if said oscillation clock signal is advanced in phase as compared to said input clock signal, then said multiplication control circuit generates a first level phase comparison signal, and if said oscillation clock signal is delayed in phase as compared to said input clock signal, then said multiplication control circuit generates a second level phase comparison signal and wherein said oscillator falls a frequency of said oscillation clock signal upon receipt of said first level phase comparison signal, whilst said oscillator rises a frequency of said oscillation clock signal upon receipt of said second level phase comparison signal.

18. The multiplying circuit as claimed in claim 17, wherein said oscillator comprises plural stages of delay circuits connected in series to each other so that said oscillator is increased in a number of said stages upon receipt of said first level phase comparison signal, whilst said oscillator is decreased in a number of said stages upon receipt of said second level phase comparison signal.

19. The multiplying circuit as claimed in claim 16, wherein said oscillator has a pulse width adjustment circuit for adjusting clock width of each clock pulse of said oscillation clock signal.

\* \* \* \* \*